United States Patent
Koga et al.

(10) Patent No.: US 7,477,218 B2
(45) Date of Patent: Jan. 13, 2009

(54) PIXEL CIRCUIT AND DISPLAY DEVICE

(75) Inventors: Masayuki Koga, Moriguchi (JP); Koji Marumo, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 467 days.

(21) Appl. No.: 10/541,373

(22) PCT Filed: Nov. 8, 2004

(86) PCT No.: PCT/JP2004/016542

§ 371 (c)(1),
(2), (4) Date: Jun. 29, 2005

(87) PCT Pub. No.: WO2005/045796

PCT Pub. Date: May 19, 2005

(65) Prior Publication Data

US 2006/0145960 A1    Jul. 6, 2006

(30) Foreign Application Priority Data

Nov. 7, 2003   (JP) ............................. 2003-378581
May 25, 2004   (JP) ............................. 2004-154092

(51) Int. Cl.
G09G 3/30  (2006.01)
G09G 3/10  (2006.01)
(52) U.S. Cl. .................... 345/80; 345/76; 315/169.3
(58) Field of Classification Search .................. 345/80
See application file for complete search history.

(56) References Cited

U.S. PATENT DOCUMENTS 6,359,605 B1 * 3/2002 Knapp et al. .............. 345/76
6,362,798 B1   3/2002 Kimura et al.
6,812,491 B2 * 11/2004 Kato et al. ................. 257/66
2003/0132931 A1   7/2003 Kimura et al.
2004/0026723 A1   2/2004 Miyazawa

OTHER PUBLICATIONS

International Search Report (ISR) for related appln No. PC//JP2004/016542 (with English translation) JP 11-272233 dated Oct. 8, 1999 (with English excerpt) JP 2003-202833 dated Jul. 18, 2003 (with English excerpt) JP 2001-42826 dated Feb 16, 2001 (with English excerpt).
Written Opinion dated Jan. 1, 2005 for related Japanese appln. JP 2004126526.

* cited by examiner

Primary Examiner—Robert R. Rainey
(74) Attorney, Agent, or Firm—Cantor Colburn LLP

(57) ABSTRACT

When a selection TFT and a correction TFT are turned on, a data voltage of a data line is stored in a storage capacitor as a gate voltage of a driving TFT. After turning off the selection TFT, a voltage of a capacitor line SC falls, thereby turning on the driving TFT to supply a driving current to an organic EL element. The correction TFT is in the ON state before the capacitor line SC falls, and is turned off in the course of the fall of the line. Consequently, the capacitance of the correction TFT changes during the fall of the gate voltage, and the gradient of the gate voltage fall of the driving TFT is changed, thereby setting the gate voltage after the capacitor line SC falls in accordance with variation in threshold of the driving TFT. Particularly by disposing the driving TFT and the correction TFT adjacent to each other, the two TFTs are provided with the same properties to achieve effective correction.

17 Claims, 13 Drawing Sheets

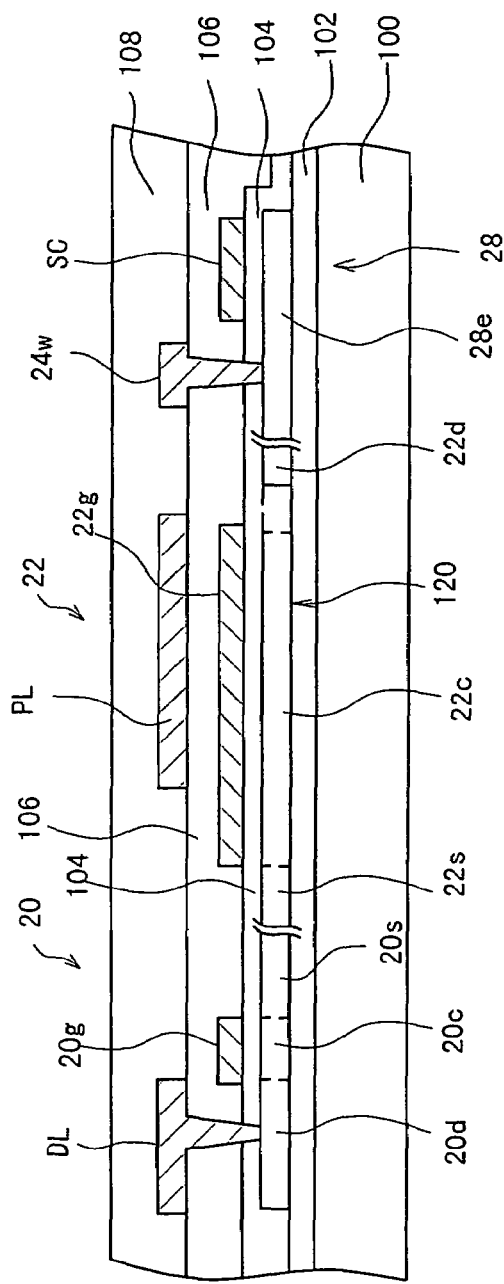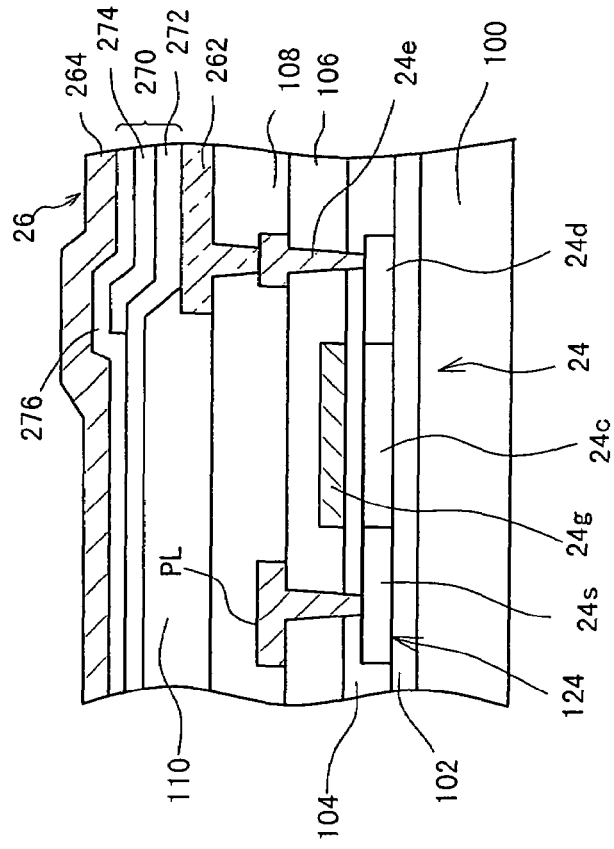
Fig. 6A
Fig. 6B

PIXEL CIRCUIT AND DISPLAY DEVICE

TECHNICAL FIELD

The present invention relates to a pixel circuit including an emissive element, such as an organic EL element, and a display device having such pixel circuits arranged in a matrix.

BACKGROND ART

Organic EL panels using organic EL elements as emissive elements have been known and actively developed. In such an organic EL panel, organic EL elements are arranged in a matrix, and light emission from these organic EL elements is individually controlled to display an image. Particularly, an organic EL panel of an active matrix type includes a TFT for display control for each pixel, and light emission is controlled for each pixel by controlling operation of the TFT, thereby achieving a very high resolution display.

FIG. 13 shows an example of a pixel circuit in an organic EL panel of the active matrix type. A data line receiving a data voltage indicating luminance of a pixel is connected to a gate of a driving TFT 12 through an n-channel selection TFT 10 whose gate is connected to a gate line. The gate of driving TFT 12 is connected to one end of a storage capacitor 14 whose other end is connected to a storage capacitor line SC for holding a gate voltage of the driving TFT 12.

The driving TFT 12 has a source connected to an EL power source line, and a drain connected to an anode of an organic EL element 16, whose cathode is connected to a cathode power source.

Such pixel circuits are arranged in a matrix, and the gate line provided for each horizontal line attains an H level with predetermined timing, thereby turning on the selection TFT 10 in that row. In this state, the data voltage is sequentially supplied to the data line. Therefore, the data voltage is supplied to, and stored in, the storage capacitor 14, and the voltage at this time is stored even after the gate line attains an L level.

The driving TFT 12 operates in accordance with the voltage stored in the storage capacitor 14, and the corresponding driving current is supplied through the organic EL element 16 from the EL power source to the cathode power source, thereby causing the organic EL element 16 to emit light in accordance with the data voltage.

The gate line sequentially attains the H level to sequentially supply an incoming video signal to the corresponding pixel as the data voltage, whereby the organic EL elements 16 arranged in a matrix emit light in accordance with the data voltage, and an image is displayed with respect to the video signal.

In such a pixel circuit, however, variation in threshold voltage among the driving TFTs of the pixel circuits arranged in a matrix results in variation in luminance and deterioration in display quality. It is difficult to obtain uniform properties of the TFTs forming the pixel circuits for the entire display panel, and therefore to prevent variation in ON/OFF threshold.

It is therefore desired to suppress effects of the variation in threshold among the driving TFTs on a display.

Various circuits to prevent the effects of difference in threshold of the TFTs have been proposed (such as JP-A-2002-514320).

However, this proposal requires a circuit to compensate for difference in threshold. Using such a circuit therefore increases the number of elements in the pixel circuit, and decrease the aperture ratio. Addition of the circuit for compensation also requires a change in peripheral circuits for driving the pixel circuit.

DISCLOSURE OF THE INVENTION

The present invention provides a pixel circuit to effectively compensate for difference in threshold voltage of a driving transistor with a simple change.

The present invention according to one aspect provides a pixel circuit comprising a selection transistor having one end connected to a data line, and a control end receiving a selection signal, a correction transistor having one end connected to the other end of the selection transistor, and a control end connected to a first power source at a predetermined voltage, a driving transistor having a control end connected to the other end of the correction transistor, and one end connected to a second power source functioning as a current supply source, a storage capacitor having one end connected to the control end of the driving transistor, and the other end connected to a pulse voltage line, and an emissive element for emitting light caused by a current flowing through the driving transistor, wherein the correction transistor is switched on and off states in a process of turning on the driving transistor by changing a voltage value of the pulse voltage line, thereby controlling a voltage of the control end of the driving transistor when it is turned on, and the driving transistor and the correction transistor are formed adjacent to each other.

Preferably, the data line and the power source line extend in a vertical scanning direction, and the correction transistor is formed between the data line and the power source line.

The driving transistor is preferably formed on a side opposite to the correction transistor with the power source line located in between.

Preferably, a data voltage for turning on the correction transistor is supplied to the data line while the selection transistor is ON, a voltage corresponding to the data voltage is stored at the control end of the driving transistor, the selection transistor is turned off thereafter, and the voltage of the control end of the driving transistor is shifted by changing the voltage of the pulse voltage line in this state, thereby turning off the correction transistor and turning on the driving transistor to cause a current in accordance with the data voltage to flow into the driving transistor.

The first power source and the second power source are preferably the same power source.

Preferably, the correction transistor and the driving transistor are p-channel transistors, and the pulse voltage line changes from a high level to a low level after the selection transistor is turned off.

The present invention according to another aspect provides a display device including a plurality of pixels arranged in a matrix, each pixel comprising a display element operating in accordance with supplied power, a selection transistor having a first conductive region connected to a data line, and a control end receiving a selection signal, a driving transistor having a first conductive region connected to a power source line for supplying power to the display element, a correction transistor having a control end connected to a first power source at a predetermined voltage, a first conductive region connected to a second conductive region of the selection transistor, and a second conductive region connected to a control end of the driving transistor, and a storage capacitor having a first electrode connected to the control end of the driving transistor and the second conductive region of the correction transistor, and a second electrode connected to a pulse voltage line. A voltage of the control end of the driving transistor is changed in response to a change in a voltage of the pulse voltage line, and in accordance with the change, the correction transistor controls the voltage of the control end in accordance with an operation threshold thereof when the driving transistor turns on. The correction transistor and the driving transistor are formed as transistors of the same conductivity type, and at least a channel region of each of the correction transistor and the driving transistor is formed of a semiconductor layer polycrystallized through laser annealing, and the channel regions thereof are disposed in close proximity to each other.

According to a further aspect of the present invention, in the above pixel circuit or the display device, a channel length direction of the correction transistor and a channel length direction of the driving transistor are disposed in parallel to a scanning direction of a line-shaped pulse laser irradiated upon the polycrystallization laser annealing, and at least part of both channel regions of the correction transistor and the driving transistor are located on the same line extending in a direction perpendicular to the scanning direction of the pulse laser.

In a display device according to a further aspect of the present invention, an arrangement may be employed in which the correction transistor and the driving transistor are formed as transistors of the same conductivity type, and at least part of an active layer of the correction transistor is formed below the power source line with an insulating layer disposed in between.

According to the present invention, in the above display device, the first power source may also be used as the power source line, and a control electrode of the correction transistor connected to the power source line may be formed between the active layer of the correction transistor and a layer of the power source line. Further, the correction transistor may include an active layer formed between the data line and the power source line to extend partially underlying at least one of these lines.

According to a further aspect of the present invention, in the above display device, the channel region of the correction transistor has portions differing in channel width in the channel length direction thereof.

As described above, according to the present invention, the correction transistor is switched on and off states in the course of turning on the driving transistor by changing the voltage value of the pulse voltage line, thereby controlling the voltage of the control end when the driving transistor is ON. Consequently, the voltage varied in accordance with the threshold voltage of the correction transistor can be set at the control end of the corresponding driving transistor. Further, because the driving transistor and the correction transistor are formed adjacent to each other, the threshold voltages of the driving transistor and the correction transistor can be set at similar voltages, thereby compensating for the threshold voltage of the driving transistor with the correction transistor, and achieving a uniform amount of current supplied to the emissive element.

The data line and the power source line extend in the vertical scanning direction, the correction transistor is formed between the data line and the power source line, and the driving transistor is formed opposite to the correction transistor sandwiching the power source line, thereby achieving efficient arrangement, and maximizing the size of a display element, such as the emissive element, to implement a display device having a high aperture ratio.

For example, an arrangement in which the active layer of the correction transistor is disposed below the power source line with an insulating layer arranged in between further enhances the design freedom of arrangement within a pixel.

When the control electrode (gate electrode) of the correction transistor is connected to the power source line, the same voltage as the power source line is applied by the control electrode to the channel region thereof even though the active layer of the correction transistor is located below the power source line, thereby suppressing effects on operation of the transistor.

The degree of freedom in arranging transistors and the like within a pixel can be also enhanced by providing the correction transistor with portions differing in the channel width in the channel length direction thereof.

With a change in voltage of the pulse voltage line, the driving transistor transitions from the OFF state to the ON state, and the correction transistor is switched on/off, whereby the capacitance thereof is changed. The level of the gate voltage of the driving transistor at which the correction transistor is switched on/off is changed in accordance with a change in threshold of the correction transistor. The change in gate voltage of the driving transistor in accordance with the change in the pulse voltage line depends on the capacitance of the correction transistor, and therefore the gate voltage is varied in accordance with the variation in threshold of the correction transistor. Consequently, easy control can be achieved by equalizing the properties of the correction transistor and the driving transistor as much as possible for the sake of changing the gate voltage of the driving transistor to cancel the variation in threshold of the driving transistor.

When the channel regions of the correction transistor and the driving transistor are both formed of a semiconductor layer polycrystallized through laser annealing, the properties can easily be equalized by disposing at least these channel regions in close proximity to each other.

For example, when an active layer polycrystallized through laser annealing is used, the channel length directions of the correction transistor and the driving transistor are disposed in parallel to the scanning direction of a line-shaped pulse laser irradiated upon polycrystallization laser annealing, so that the laser pulse can be irradiated a plurality of times in the channel length direction, which significantly affects electrical mobility of the transistor, thereby reducing variation in properties of each transistor among pixels. By arranging at least part of the channel regions of the correction transistor and the driving transistor juxtaposed on the same line extending in the direction perpendicular to the scanning direction of the pulse laser, the channel regions of the two transistors are irradiated with the same laser beam, thereby achieving closer properties thereof.

When the first and second power sources are provided as the same power source, the need to provide separate power source lines can be eliminated.

When the correction transistor and the driving transistor are both provided as p-channel transistors, the gate capacitance of the p-channel transistor can effectively be used by the change in the pulse voltage line from the high level to the low level after the selection transistor is turned off.

BRIEF DESCRIPTION OF THE DRAWINGS

FIGS. 6A and 6B schematically show cross sectional configurations taken along lines A-A and B-B, respectively, in FIG. 5.

THE BEST MODE FOR CARRYING OUT THE INVENTION

An embodiment of the present invention will now be described with reference to the accompanying drawings.

Figure 1:
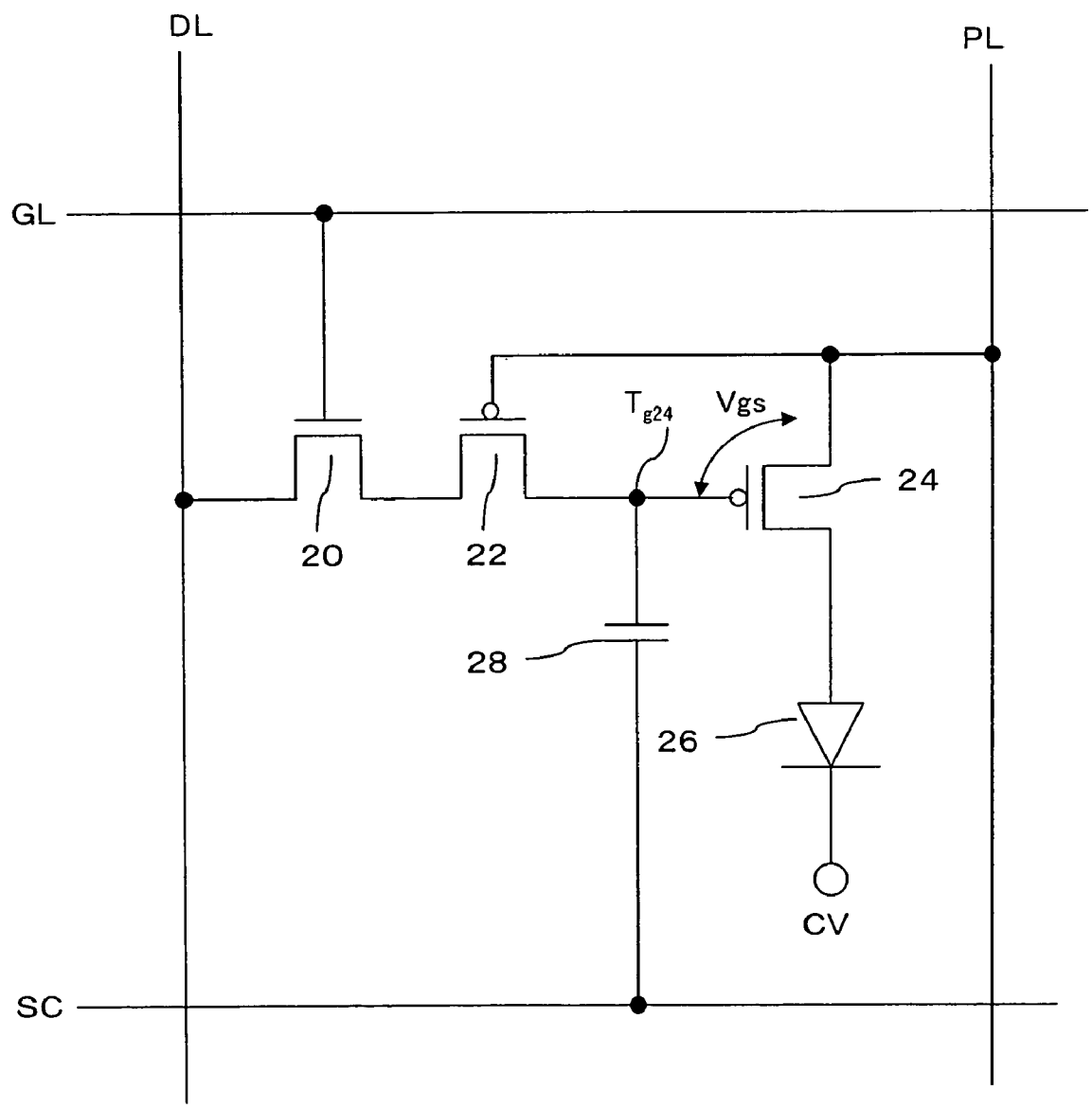
FIG. 1 shows a configuration of a pixel circuit according to an embodiment of the present invention.

FIG. 1 shows a configuration of a pixel circuit per pixel according to an embodiment. A data line DL extending in a vertical scanning direction is connected to a first conductive region (drain) of an n-channel selection TFT 20. The selection TFT 20 has a gate (control end) connected to a gate line GL extending in a horizontal scanning direction, and a second conductive region (source) connected to a first conductive region (source) of a p-channel correction TFT 22. The selection TFT 20 may have a p-channel, and for the p-channel TFT, the polarity (H level or L level) of a selection signal (gate signal) provided to the gate line GL will be inverted for driving the transistor.

A control end (gate) of the correction TFT 22 is connected to a power source line PL (voltage Pvdd), and a second conductive region (drain) is connected to a control end (gate) of a p-channel driving TFT 24. The gate of the driving TFT 24 is also connected to one end (first electrode) of a storage capacitor 28, whose other end (second electrode) is connected to a storage capacitor line (hereinafter referred to as a "capacitor line") SC acting as a pulse voltage line driven by a pulsed voltage. The capacitor line SC extends in the horizontal scanning direction, as does the gate line GL. If another power source line is provided to connect to the gate of the correction TFT 22, the timing to switch off the correction TFT 22 from the ON state can be adjusted as desired.

The driving TFT 24 has a first conductive region (source) connected to the power source line PL extending in the vertical scanning direction, and a second conductive region (drain) connected to an anode of an organic EL element 26. A cathode of the organic EL element 26 is connected to a cathode power source CV at a predetermined low voltage. The cathode of the organic EL element 26 is usually shared by all pixels, and such a cathode is connected to the cathode power source CV.

In an organic EL panel, such pixel circuits are arranged in a matrix, and at the timing that a video signal is supplied on a corresponding horizontal line, a gate line for that horizontal line attains an H level, thereby turning on the selection TFT 20 in that row. As a result, the source of the correction TFT 22 attains a potential of the data line DL.

The data line DL receives a data voltage. This data voltage Vdata corresponds to the video signal for display at a corresponding pixel, and represents, for example, a range from white level to black level in the voltage range of approximately 3 to 5 V. On the other hand, the voltage Pvdd of the power source line PL is set at approximately 0 V. Consequently, when the selection TFT 20 is turned on and the data voltage Vdata on the data line DL is applied to the correction TFT 22 (in this example the source thereof), the correction TFT 22 is turned on, and the data voltage Vdata is set at the gate (node Tg24) of the driving TFT 24. In other words, a voltage of approximately 3-5 V is set at the gate of the driving TFT 24 in a period of writing the data voltage Vdata to each pixel. The capacitor line SC connected to the other end of the storage capacitor 28 is set at approximately +8 V.

After such data voltage Vdata is thus written to the gate of the driving TFT 24, the voltage of the capacitor line SC is reduced to, for example, −4 V. In response to such a reduction, the gate voltage of the driving TFT 24 is lowered by approximately 12 V, and the driving TFT 24 is turned on, whereby the current in accordance with the data voltage is supplied to the organic EL element 26 from the power source line PL through the driving TFT 24, causing light emission.

Since the voltage of the capacitor line SC is decreased from +8 V to approximately −4 V, a voltage of the drain (node Tg24) of the correction TFT 22 changes from 3-5 V to basically a negative voltage in the order of −9 V to −7 V (this voltage varies slightly as described hereinafter), and turns into an OFF state from an ON state. The gate capacitance of the correction TFT 22 is varied with such a turn-off of the correction TFT 22, and therefore the timing at which the capacitance, i.e. a threshold Vth22 of the correction TFT 22, is changed has an influence on the eventual gate potential of the driving TFT 24. Consequently, variation in a threshold voltage Vth24 of the driving TFT 24 can be compensated by the correction TFT 22.

Note that the driving TFT 24 is turned on and supplies a corresponding driving current in accordance with a difference between the power source voltage Pvdd and the gate voltage Vg24, i.e. Vgs24. When the voltage Vgs24 exceeds the threshold voltage Vth24 determined by the properties of the TFT, the driving TFT 24 starts supplying a current, and the amount of the driving current is determined by the difference between the gate voltage Vg24 and the threshold voltage Vth24. Meanwhile, it is difficult to completely equalize the threshold voltage Vth24 of the driving TFT 24 in each of a multitude of pixels arranged in a matrix on a substrate, and some variation in the threshold voltage Vth24 depending on positions of the pixels cannot be avoided. Because the organic EL element 26 emits light at a luminance in accordance with the amount of supplied driving current, the luminance of light emitted from each pixel varies with the variation in the threshold voltage Vth24 of the driving TFT 24. The configuration according to the present embodiment compensates for the variation in luminance of emitted light with the change in capacitance of the correction TFT 22.

Figure 2:
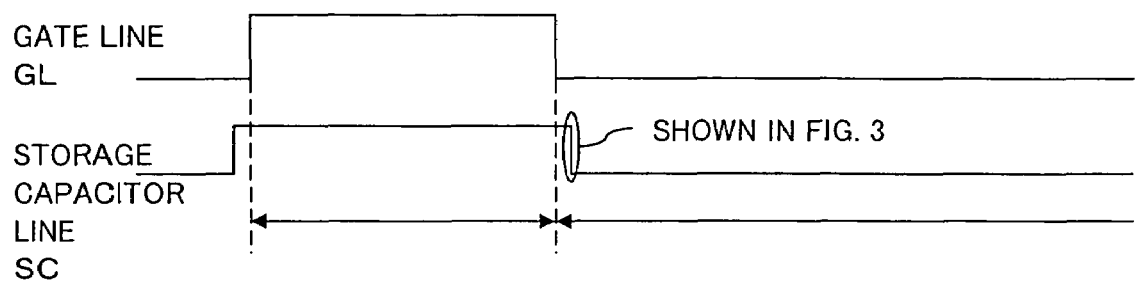
FIG. 2 is a timing chart of signals applied to a gate line GL and a capacitor line SC according to the embodiment of the present invention.
Figure 3:
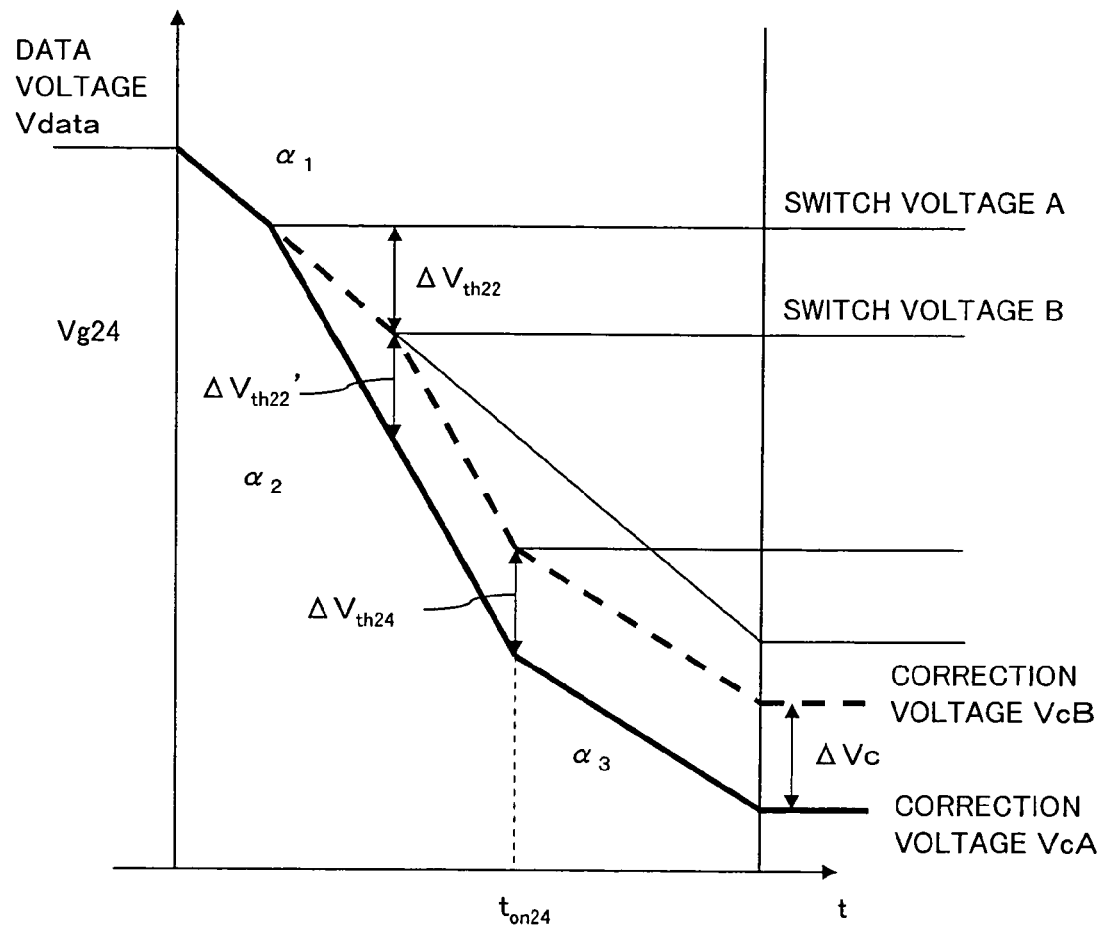
FIG. 3 shows how a gate voltage $V_{g24}$ is changed according to the embodiment of the present invention.

The principles of compensating for the variation in luminance of emitted light will be described with reference to FIGS. 2 and 3. FIG. 3 is an enlarged view of a falling edge of the capacitor line SC circled in FIG. 2. Referring to FIG. 2, the gate line GL attains an active (H) level when the corresponding row (horizontal line) is selected. In this example, the selection TFT 20 has an n-channel, the L level and H level of the gate line GL are set approximately at −4 V and 8 V, respectively, and the voltage is set at 8 V when it is selected (activated).

On the other hand, a voltage $V_{SC}$ of the capacitor line SC attains an H level for a period slightly longer than the selection (H level) period of the gate line GL. In other words, the voltage attains the H level before the gate line GL attains the H level, and attains the L level after the gate line GL attains the L level.

During the period the gate line GL is at the H level, the selection TFT 20 and the correction TFT 22 corresponding to this gate line GL are turned on, and the data voltage Vdata supplied to the data line DL is applied to the node Tg24 through the selection TFT 20 and the correction TFT 22. In other words, the gate voltage $V_{g24}$ of the driving TFT 24 is set at the data voltage Vdata.

After the gate line GL attains the L level and the data voltage Vdata is written, the voltage of the capacitor line SC falls, and, in response to the fall, the potential of the node Tg24 decreases, whereby the correction TFT 22 turns off in the course of time. The gate voltage $V_{g24}$ of the driving TFT 24 becomes lower than the data voltage Vdata by a predetermined voltage in accordance with the decrease (12 V in this example; from 8 V to −4 V) of the capacitor line SC, and the TFT 24 supplies the driving current in accordance with this voltage.

The correction TFT 22 is provided for each pixel, arranged adjacent to the driving TFT 24 for that pixel, and formed through the same step as the driving TFT 24. Particularly, the TFT properties can be made uniform by simultaneous radiation of the same laser pulse to the active regions of the driving TFT 24 and the correction TFT 22 for polycrystallization when, for example, polycrystalline silicon obtained by polycrystallizing amorphous silicon through laser annealing is used as active layers of, for example, the driving TFT 24 and the correction transistor 22 as well as the selection TFT 20, as described hereinafter. The impurity concentration doped to the active layer can be made substantially the same. As a result, the driving TFT 24 and the correction TFT 22 have substantially the same threshold voltage. Because the gate of the correction TFT 22 is connected to the power source line PL (Pvdd=0 V in this example), it changes from the ON state to the OFF state in response to the decrease in the voltage $V_{g24}$ at the node Tg24.

Thus, the correction TFT 22, which is a p-channel TFT, changes from the ON state to the OFF state at the fall of the capacitor line SC, while the driving TFT 24 changes from the OFF state to the ON state. The gate capacitance Cg of the TFT is changed depending on whether it is in the ON state or the OFF state. Consequently, the change in the gate voltage $V_{g24}$ of the driving TFT 24 is affected by the changes in the ON/OFF state of the two TFTs 22 and 24. More specifically, the capacitance Cg is larger when the TFT is ON, and smaller when it is OFF. Because the capacitance is larger in the ON state than in the OFF state, the voltage change is affected by the capacitance change.

In other words, when the correction TFT 22 transitions from the ON state to the OFF state, and the gate capacitance $C_{g22}$ thereof is decreased, a gradient $\alpha$ of decrease in the voltage $V_{g24}$ is increased.

Consequently, when a switch voltage at which the correction TFT 22 of a given pixel is switched from the ON state to the OFF state is a "switch voltage A" in FIG. 3, the voltage of the node Tg24 (gate voltage $V_{g24}$) changes as indicated by a solid line in the figure. More specifically, the gate voltage $V_{g24}$ changes (decreases) at a first gradient $\alpha_1$ from the temporarily set data voltage Vdata before reaching the switch voltage A, and changes (decreases) at a second gradient $\alpha_2$ after reaching the switch voltage A. When the driving TFT 24 is turned on, the voltage changes (decreases) at a third gradient $\alpha_3$. When a predetermined period is elapsed after the voltage of the capacitor line SC attains the L level, the voltage $V_{g24}$ is set at a correction voltage VcA.

The switch voltage at which the correction TFT 22 is switched from the ON state to the OFF state is determined by the difference $V_{gs22}$ between the power source voltage Pvdd=0, which is the gate voltage of the correction TFT 22, and the source voltage thereof. Consequently, the switch voltages A and B are equal to a sum of the power source voltage Pvdd and the absolute value of the threshold voltage $V_{th22}$ of the correction TFT 22 (Pvdd+|$V_{th22}$|)

On the other hand, when the threshold voltage $V_{th22}$ of the correction TFT 22 is the "switch voltage B" lower than the "switch voltage A", the gate voltage $V_{g24}$ changes as indicated by a broken line in FIG. 3. More specifically, the gate voltage $V_{g24}$ changes (decreases) at the first gradient $\alpha_1$ from the temporarily set data voltage Vdata before reaching the switch voltage B, and changes (decreases) at the second gradient $\alpha_2$ after reaching the switch voltage B. When the driving TFT 24 is turned on, the voltage changes (decreases) at the third gradient $\alpha_3$. When a predetermined period is elapsed after the voltage of the capacitor line SC attains the L level, the voltage $V_{g24}$ is set at a correction voltage VcB.

Thus, even though the same data voltage Vdata is supplied at first to the node Tg24, the eventual gate voltage $V_{g24}$ of the driving TFT 24 is set at a correction voltage Vc which takes a higher value for a lower threshold voltage.

As described above, the threshold voltage $V_{th24}$ of the driving TFT 24 corresponds to the threshold voltage $V_{th22}$ of the correction TFT 22. As a result, when the threshold voltage $V_{th24}$ of the driving TFT 24 is "$V_{th24}$A", the gate voltage $V_{g24}$ is set at the correction voltage VcA corresponding to the threshold voltage $V_{th24}$A. When the threshold voltage is "$V_{th24}$B", the gate voltage $V_{g24}$ is set at the correction voltage VcB corresponding to the threshold voltage $V_{th24}$B. The difference between the threshold voltage Vth24 and the corrected gate voltage $V_{g24}$ remains the same whether the threshold voltage is $V_{th24}$A or $V_{th24}$B in this example. That is, as long as the same data voltage Vdata is maintained through setting of the size of the correction TFT 22, the power source voltage Pvdd, the size of the driving TFT 24, the capacitance Cs of the storage capacitor 28, and the like, the difference between the threshold voltage $V_{th24}$ and the gate voltage $V_{g24}$ can be fixed even though the threshold voltage $V_{th24}$ of the driving TFT 24 varies with the pixel, thereby eliminating the effects of variation in threshold voltage $V_{th24}$ of the driving TFT 24.

For such a compensation, the second gradient $\alpha_2$ is preferably set to twice the value of the first gradient $\alpha_1$. Such condition setting will be described with reference to FIG. 3. Referring to FIG. 3, when the correction TFT 22 is ON, the capacitance $C_{g22}$ thereof is greater than in the OFF state, the effects of the change in pulse driving voltage on the change in the gate voltage $V_{g24}$ is suppressed, and the gradient $\alpha_1$ is smaller. On the other hand, when the correction TFT 22 is off, the capacitance $C_{g22}$ is smaller, and the effects of the change in pulse driving voltage are greater, whereby the gradient $\alpha_2$ is greater. Because the gradient $\alpha_2$ is set to twice the value of the gradient $\alpha_1$, the decrease in the gate voltage $V_{g24}$ when the pulse driving voltage attains the L level is twice as big in the OFF state of the correction TFT 22 than in the ON state.

More specifically, the TFT is formed so that a difference $\Delta V_{th24}$ in threshold voltage between the two driving TFTs 24 is equal to a difference $\Delta V_{th22}$ in threshold voltage between the two correction TFTs 22, and the gradient is doubled when the correction TFT 22 is switched off from the ON state, whereby the relation $\Delta V_{th22} = \Delta V_{th24}$ holds true, and a difference $\Delta Vc$ between two correction voltages (VcA and VcB) is equal to $\Delta V_{th24}$.

In other words, referring to FIG. 3, all the following factors are equal to one another:

(i) a difference ($\Delta V_{th22}$) between the switch voltages A and B of the two correction TFTs 22

(ii) a difference ($\Delta V_{th22}'$) between the switch voltage B (the one switched later: the lower voltage in this example) and the voltage $V_{g24}A$ of a node Tg24A in a pixel including the correction TFT 22 having the switch voltage A when the node Tg24B in the pixel reaches the switch voltage (iii) a difference ($\Delta Vth_{24}$) in the switch voltage between the two driving TFTs 24

(Vi) a difference ($\Delta Vc$) between the correction voltages VcA and VcB.

Note that even when a sampling voltage, a voltage written as the data voltage Vdata, is changed, the switch voltage difference $\Delta V_{th22}$ remains equal to the correction voltage difference $\Delta Vc$ because the gradient is the same, so that the fluctuation in threshold voltage can always be compensated.

Further, experiments have shown that the potential difference of the data voltage is amplified twice in the correction voltage after the compensating operation. As a result, the range of the data voltage can be reduced, and a sufficient difference in gate voltage of the driving TFT 24 can be maintained, thereby reducing the load of a circuit for supplying the data voltage, and facilitating formation thereof.

As described above, the change in gate voltage of the driving TFT 24 when the voltage of the capacitor line SC falls is affected particularly by the gate capacitance $C_{g22}$ of the correction TFT 22, the gate capacitance $C_{g24}$ of the driving TFT 24, the capacitance Cs of the storage capacitor 28, and a parasitic capacitance Cw of a wiring line.

The mechanism of the above-mentioned change in the voltage $V_{g24}$ will be described based on the amount of movement of electric charges. It is defined here that the capacitance of the storage capacitor 28 will be denoted as Cs, the gate capacitance of the correction TFT 22 as $C_{g22}$, the gate capacitance of the driving TFT 24 as $C_{g24}$, the threshold voltage of the correction TFT 22 as $V_{th22}$, the threshold voltage of the driving TFT 24 as $V_{th24}$, and the capacitance Cs of the storage capacitor 28 is equal to the gate capacitance $C_{g22}$ of the correction TFT 22.

(i) First, when the voltage of the capacitor line SC is decreased by 12 V while the gate voltage $V_{g24}$ of the driving TFT 24 is equal to Vdata, the voltage $V_{g24}$ of the node Tg24 should also be decreased by 12 V. Assuming that the voltage $V_{g24}$ taking only this change into consideration is denoted as $V_{g24'}$, the equation $V_{g24'} = Vdata - 12$ is established.

(ii) Assuming that the gate capacitance of the correction TFT 22 is denoted as $C_{g22}$, an amount $Q_{f22}$ of charges flowing into the storage capacitor 28 from the correction TFT 22 can be expressed as follows:

$$Q_{f22} = C_{g22} \times (Vdata - |V_{th22}|)$$

According to the present embodiment, the capacitance $C_{g22}$ is equal to Cs, and the voltage $V_{g24}$ of the node Tg24 is increased by $(Vdata - |V_{th22}|)$, as described above. Thus, the voltage $V_{g24}''$ taking into this increase into consideration becomes:

$$V_{g24}'' = 2Vdata - 12 - |V_{th22}|.$$

(iii) Further, electric charges also flow from the gate of the driving TFT 24 into the storage capacitor 28. The amount $Q_{f24}$ of charges can be expressed as follows:

$$Q_{f24} = -C_{g24}' \times (V_{g24} + |V_{th24}|)$$

wherein the eventual gate voltage of the driving TFT 24 is $V_{g24}$, the value $C_{g24}'$ is a difference in capacitance of the driving TFT 24 between ON and OFF states, derived from the equation $C_{g24}' = C_{g24} \times 2/3$ using the Meyer's equation in SPICE simulator.

(iv) The gate voltage $V_{g24}$ of the driving TFT 24 can be regarded as a voltage shifted by the amount of the electric charges $Q_{f24}$ flowing into the storage capacitor 28. Thus, $$V_{g24} = V_{g24}'' + Q_{f24}/C_{g22}$$
$$= V_{g24}'' - C_{g24}'(V_{g24} + |V_{th24}|)/C_{g22}$$

Rewriting the above equation, the eventual voltage $V_{g24}$ is obtained as follows:

$$(1 + C_{g24}'/C_{g22})V_{g24} = 2Vdata - 12 - |V_{th22}| - C_{g24}'/C_{g22})|V_{th24}|$$

When $V_{th22} = V_{th24} = V_{th}$, the voltage $V_{g24}$ takes the following value:

$$V_{g24} = -|V_{th}| + (2Vdata - 12)/(1 + C_{g24}'/C_{g22})$$

The second term on the right hand side in the above equation is a fixed value based on the layout dimension, the voltage $V_{g24}$ is shifted by $V_{th}$, and therefore the shift in the threshold voltage $V_{th}$ of the driving TFT 24, if any, can be compensated.

Strictly speaking, the parasitic capacitance of the wiring line must also be taken into consideration, and the values may be set in consideration thereof. Further, when the power source voltage Pvdd is not 0 V, that value may also be taken into consideration.

In addition, when the threshold voltage $V_{th22}$ of the correction TFT 22 differs from the threshold voltage $V_{th24}$ of the driving TFT 24, the gate voltage $V_{g24}$ is desirably shifted by the threshold $V_{th24}$ of the driving TFT 24. To that end, the factor $C_{g24}'/C_{g22}$ in the above expression should be adjusted. However, because a big adjustment is difficult, the TFTs are preferably formed to achieve the relation $V_{th22} = V_{th24}$ as much as possible.

Figure 4:
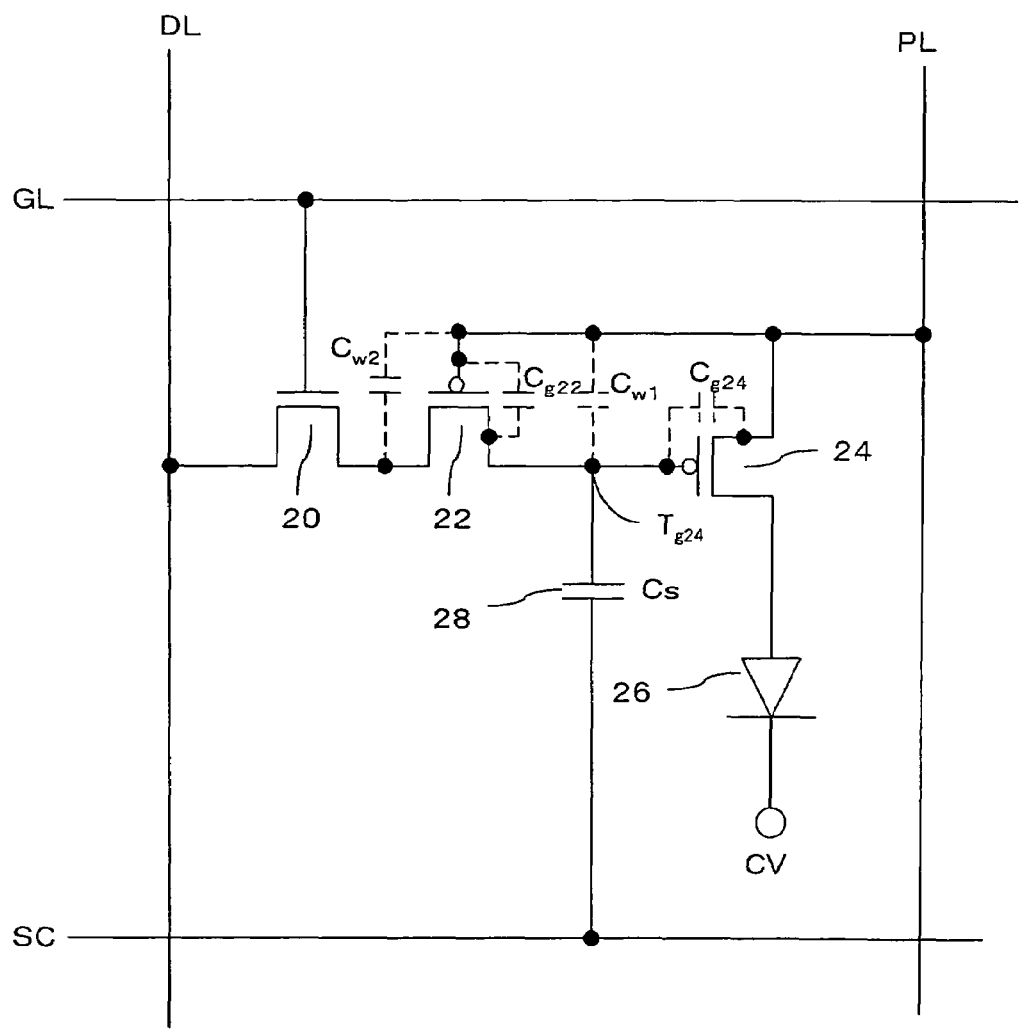
FIG. 4 is a diagram for describing a capacitor present in the pixel circuit according to the embodiment of the present invention.

The relations among various capacitors in the pixel circuit according to the embodiment of the present invention will further be described with reference to FIG. 4. To the pixel circuit according to the present embodiment, various parasitic capacitances including the above-described gate capacitance $C_{g22}$ of the correction TFT 22, and the gate capacitance $C_{g24}$ of the driving TFT 24 are connected in addition to the storage capacitor Cs. By way of example, capacitances, such as a parasitic capacitance $C_{w1}$ between the power source line PL and the connection point (node) Tg24 between the drain of the correction TFT 22 and the gate of the driving transistor 24, and a parasitic capacitance $C_{w2}$ between the power source line PL and a connection portion between the sources of the correction TFT 22 and the selection TFT 20, are present as illustrated in FIG. 4. The relation between the gradient α of the decline in the voltage $V_{g24}$ of the node Tg24 in FIG. 3 and these parasitic capacitances will be described. The gradient $\alpha_1$ before reaching the switch voltage (A or B) from the data voltage Vdata in FIG. 3 can be expressed as:

$$\alpha_1 = Cs/(C_{w1}+C_{w2}+Cs+C_{g22})$$

Electric charges flow into the storage capacitor Cs in the state where predetermined electric charges are charged in all these parasitic capacitances ($C_{w1}$, $C_{w2}$, $C_{g22}$), and therefore the gradient $\alpha_1$ of the decline in the gate voltage $V_{g24}$ can be expressed as the above equation.

The gradient $\alpha_2$ of the decline in the voltage $V_{g24}$ at the node Tg24 between the time the switch voltage is reached and the time the driving TFT 24 is turned on can be expressed as:

$$\alpha_2 = Cs/(Cs+C_{w1})$$

This is because the correction TFT 22 is turned off after reaching the switch voltage, and the gate capacitance $C_{g22}$ thereof and the parasitic capacitance $C_{w2}$ between the power source line PL and its source are electrically disconnected from the storage capacitor 28 (whose capacitance is Cs).

Note that the value $\alpha_2$ is set equal to $2\times\alpha_1$. Therefore, by setting the capacitance Cs of the storage capacitor 28 so that the capacitance Cs is equal to $C_{g22}-C_{w1}+C_{w2}$, the gradient $\alpha_2$ of the decline in the gate voltage Vg24 of the driving TFT 24 can be set to twice the gradient $\alpha_1$ by switching off the correction TFT 22 from the ON state when the voltage of the capacitor line SC falls, so that variation in threshold voltage of the driving TFT 24 can be properly compensated.

The gradient $\alpha_3$ after the driving TFT 24 turns on shown in FIG. 3 can be expressed as:

$$\alpha_3 = Cs/(Cs+C_{w1}+C_{g24})$$

The value $C_{g24}$ is the gate capacitance of the driving TFT 24 as described above, and is connected to the storage capacitor 28 by turning on the driving TFT 24. The gradient $\alpha_3$ of the voltage drop is also affected by this capacitance $C_{g24}$. The timing $t_{on24}$ at which the driving TFT 24 turns on does not depend on the switch voltage of the driving TFT 24, i.e. the threshold voltage $V_{th24}$ thereof, as described above, but is simultaneous in all pixels. More specifically, it is the timing when the gate voltage Vg24 in each pixel circuit is simultaneously decreased to the voltage lower by a voltage according to its own threshold voltage $V_{th24}$ than the power source voltage Pvdd caused by each correction TFT 22 turning off at the timing in accordance with variation in the threshold voltage $V_{th22}$ thereof.

Figure 5:
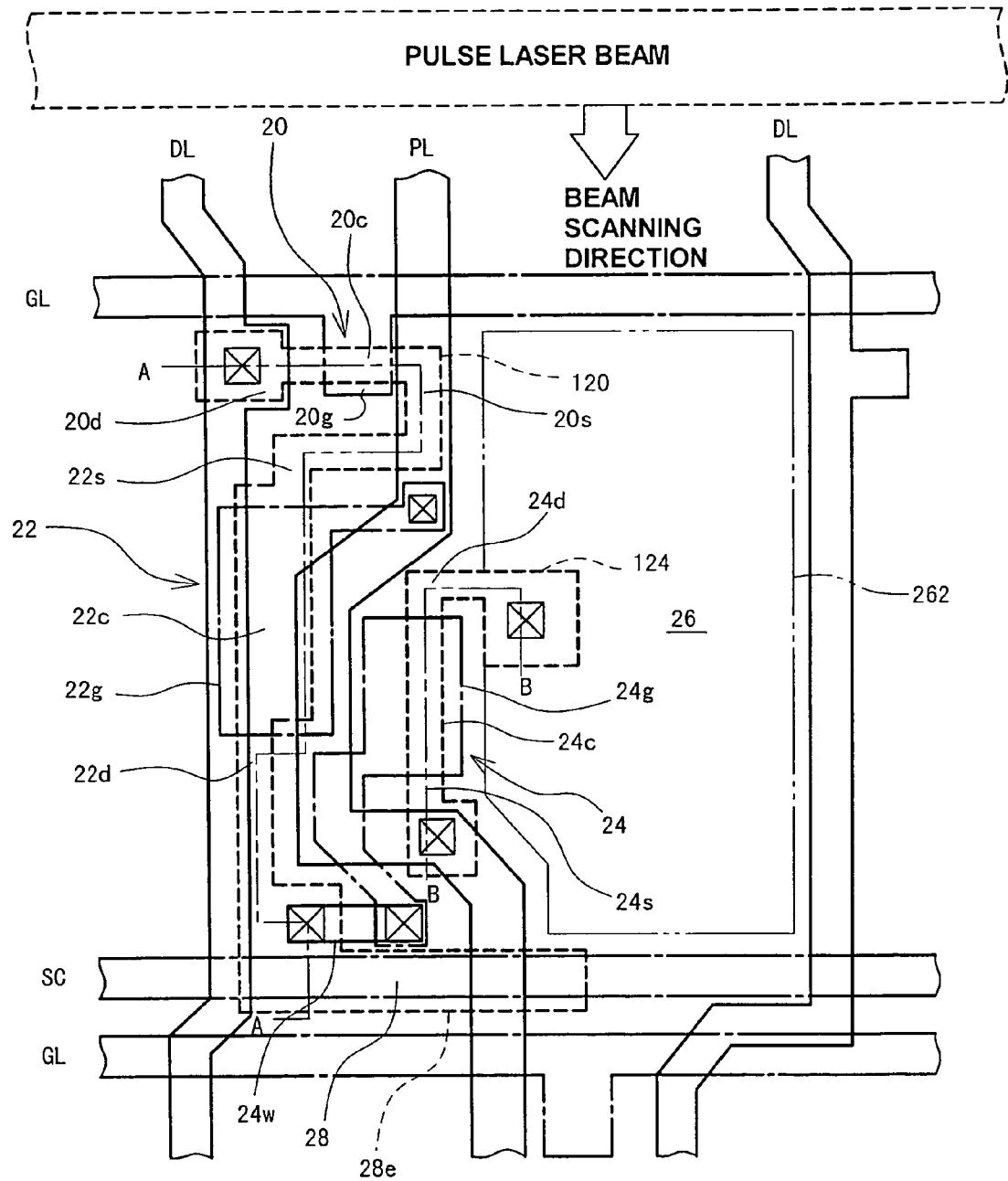
FIG. 5 shows an example of a planar configuration of a pixel according to the embodiment of the present invention.

A layout of pixels each including such a pixel circuit will be described with reference to FIG. 5 and FIGS. 6A and 6B. FIG. 5 shows a schematic planar configuration of a pixel, and FIGS. 6A and 6B show schematic cross sectional configurations taken along lines A-A and B-B, respectively, in FIG. 5.

On a transparent insulating substrate 100 of glass or the like, a buffer layer 102 is formed. Semiconductor layers (120, 124, 28e) formed of polycrystalline silicon on the buffer layer to constitute active layers of TFTs and a capacitor electrode are indicated by a broken line in FIG. 5. In FIG. 5, the gate line GL, the capacitor line SC, the gate electrode 22g of the correction TFT 22, and the gate electrode 24g of the driving TFT 24 formed of a refractory metal material, such as Cr, above the above-described semiconductor layers are indicated by a dash-dotted line. The data line DL and the power source line PL provided above the semiconductor layer and the above lines GL and SC and formed of a low resistance metal material, such as AL, and a metal wiring line 24w formed in the same layer as these lines are indicated by a solid line.

In the layout of FIG. 5, each pixel is located between the gate lines GL formed along a horizontal scanning (H) direction of a display device, and between the data lines DL formed substantially along a vertical scanning (V) direction of the display device. The power source line PL is formed in the vertical scanning direction (column direction of the matrix) substantially juxtaposed with the data line DL. In each pixel region, the power source line extends between the data line DL and the organic EL element 26 of the pixel connected to that data line DL. As described hereinafter, the selection TFT 20, the correction TFT 22, and the storage capacitor 28 are disposed between the data line DL and the power source line PL, and the driving TFT and the organic EL element 26 are disposed between the power source line PL and the data line DL in the next column.

The selection TFT 20 is formed near an intersection between the gate line GL and the data line DL. The gate line GL includes a projected portion formed toward the pixel region, covering and crossing part of the semiconductor layer 120 extending along the gate line GL with a gate insulating film 104 interposed therebetween. This portion projected from the gate line GL functions as the gate electrode 20g of the TFT 20, and the region of the semiconductor layer 120 covered with the gate electrode 20g functions as the channel region.

The correction TFT 22 connected to the selection TFT 20 is disposed so that the channel length direction thereof runs along the direction in which the data line DL extends (vertical scanning direction) in a region sandwiched by the data line DL and the power source line PL. The active layer of the correction TFT 22 is formed below the data line DL to underlie part of the data line DL. The storage capacitor 28 is disposed between the correction TFT 22 and the capacitor line SC disposed in close proximity to the gate line GL in the next row, more specifically along the capacitor line SC. The driving TFT 24 is disposed in a region (on the side of the organic EL element region 26) opposite to the region where the correction TFT 22 is formed sandwiching the power source line PL. At least a channel region 24c of the semiconductor layer 124 constructing the active layer thereof is positioned as close as possible to a channel region 22c of the correction TFT 22 according to this layout.

In the present embodiment, the active layers of the selection TFT 20 and the correction TFT 22, and the capacitor electrode 28e of the storage capacitor 28 are integrally formed of the single semiconductor layer 120. (Naturally, they may also be provided as separate layers electrically connected with one another through predetermined wiring.)

In the region for forming the selection TFT 20, the data line DL and the semiconductor layer 120 are connected through a contact hole formed penetrating the gate insulating film 104 and an interlayer insulating film 106. The semiconductor layer 120 extends from a region located under the data line DL (a region contacting the data line DL) to a position underlying the power source line PL along the gate line GL, and from this underlying position extends below the power source line PL in the vertical scanning direction along the direction in which the power source line PL extends. Further, just before reaching a contact between the gate electrode 22g of the correction TFT 22 and the power source line PL, the semiconductor layer 120 bends in the direction parallel to the extending direction of the gate line GL from the position located under the power source line PL, and extends toward the data line DL.

In the region where the selection TFT 20 is formed, an impurity doped region of the semiconductor layer 120 connected to the data line DL functions as a first conductive region (such as a drain region 20d), and an intrinsic region thereof underlying the gate electrode 20g and where no impurities are doped functions as a channel region 20c. A second conductive region (such as a source region 20s) to which impurities of the same conductivity type as the first conductive region are doped is formed on the opposite side sandwiching the channel region 20c.

The semiconductor layer 120 extending toward the data line DL from the portion underlying the power source line PL bends, in the direction the data line DL extends, near a site where it crosses the data line DL again (near the first conductive region 20d of the selection TFT 20), and extends in the vertical scanning direction in a region between the data line DL and the power source line PL, with at least part of the layer 120 underlying the region where the power source line PL is formed (and partially underlying the data line DL in this example).

The region of the semiconductor layer 120 located along the data line DL forms the active layer of the correction TFT 22. Above this active layer, the gate electrode 22g of the correction TFT 22 is disposed with the gate insulating film 104 interposed therebetween. The gate electrode 22g is connected to the power source line PL through a contact hole formed in the interlayer insulating film 106. The gate electrode 22g extends toward the data line DL from the position contacting the power source line PL, bends at a position overlapping the semiconductor layer 120 (active layer of the correction TFT 22), extends in the direction the data line DL extends, covers above the semiconductor layer 120, and is located below the data line DL and the power source line PL underlying part of these layers.

The region of the semiconductor layer 120 covered with the gate electrode 22g functions as the channel region 22c, which is not doped with impurities, of the correction TFT 22. With the channel region 22c in between, a first conductive region (such as a source region 22s in this example) doped with impurities of the conductivity type different from the selection TFT 20 is formed on the selection TFT 20 side, and a second conductive region (a drain region 22d in this example) doped with the impurities of the conductivity type same as the first conductive region 22s is formed on the capacitor line SC side. Because at least the channel region 22c of the correction TFT 22 is provided below, and partly underlying, the data line DL and the power source line PL, the correction TFT 22 can be efficiently disposed in a very small region between the data line DL and the power source line PL. Further, the channel region 22c is electrically shielded from the data line DL by disposing the gate electrode 22g between layers of the channel region 22c and of the data line DL and the power source line PL, thereby preventing the data signal applied to the data line DL from affecting operation of the correction TFT 22. Further, because at least the gate electrode 22g of the correction TFT 22 is connected to the power source line PL, the voltage applied to the channel region 22c is substantially the same in the arrangement where the active layer, particularly the channel region 22c, of the correction TFT 22 is provided underlying the power source line PL as in the arrangement where the channel region 22c is covered with the gate electrode 22g. Consequently, it is also possible to provide a major portion of the active layer of the correction TFT 22 under the power source line PL, and such an arrangement can maximize the aperture ratio in each pixel, i.e. the area for forming the organic EL element 26 contributing to light emission.

The semiconductor layer 120 is patterned to extend from the region for forming the second conductive region of the correction TFT 22 toward the capacitor line SC, bend at a site crossing the capacitor line SC, and underlie the capacitor line SC in the extending direction of the capacitor line SC, i.e. the horizontal scanning direction, with the gate insulating film 104 interposed therebetween. The region of the semiconductor layer 120 underlying the capacitor line SC functions as the capacitor electrode (first electrode) 28e, and the region including the capacitor line SC (second electrode) and the capacitor electrode 28e disposed opposite to each other sandwiching the gate insulating film 104 functions as the storage capacitor 28.

Between the second conductive region 22d of the correction TFT 22 and the capacitor electrode 28e of the storage capacitor 28, the metal wiring line 24w is connected via a contact hole formed through the interlayer insulating film 106 and the gate insulating film 104. The metal wiring line 24w is formed along the extending direction of the capacitor line SC, and connected to the gate electrode 24g of the driving TFT 24 via a contact hole formed through the interlayer insulating film 106.

The gate electrode 24g of the driving TFT 24 extends from the region contacting the metal wiring line 24w toward the gate line GL for its own row (upward in the figure), crosses under the power source line PL along the way, and extends on the organic EL element 26 side of the power source line PL in the extending direction of the power source line PL.

The power source line PL bends toward the data line DL from near the region contacting the gate electrode 22g of the correction TFT 22, bends again toward the organic EL element 26 near the above-described metal wiring line 24w to circumvent the region where the line 24w is formed, and extends in the vertical scanning direction toward the pixel in the next row from near the region contacting the semiconductor layer 124 constituting the active layer of the driving TFT 24. The driving TFT 24 is formed in a space created between the organic EL element 26 and the power source line PL because the power source line PL approaches the data line DL.

In the semiconductor layer 124 constituting the active layer of the driving TFT 24, the channel region 24c is formed in a region covered with the overlying gate electrode 24g, a first conductive region (a source region 24s in this example) is formed on the side connecting to the power source line PL, and a second conductive region (a drain region 24d in this example) is formed on the side connecting to the organic EL element 26. The channel region 24c is an intrinsic region to which no impurities are doped, and the first and second conductive regions (24s and 24d) provided on opposite sides thereof are doped with the impurities of the same conductivity type as that of the above-described correction TFT 22. The first conductive region 24s of the driving TFT 24 is connected to the power source line PL via a contact hole formed through the interlayer insulating film 106 and the gate insulating film 104. The second conductive region 24d of the driving TFT 24 is connected to a connection electrode 24e formed of the same material as, for example, the above-described power source line PL, via a contact hole formed through the interlayer insulating film 106 and the gate insulating film 104.

As illustrated in FIGS. 6A and 6B, a planarization insulating layer 108 of an organic resin or the like to planarize the upper surface is formed over the entire substrate covering the data line DL, the power source line PL, the above-described metal wiring line 24w, and the connection electrode 24e. In the planarization insulating layer 108, a contact hole is formed in a region for forming the connection electrode 24e connected to the above-described driving TFT 24. Through this contact hole, a first electrode 262 (an anode in this example) of the organic EL element 26 formed on the planarization insulating layer 108 and the connection electrode 24e are connected. When the connection electrode 24e is not provided, the first electrode 262 of the organic EL element 26 and the second conductive region 24d are directly connected by forming a contact hole penetrating the planarization insulating layer 108, the interlayer insulating film 106, and the gate insulating film 104 in the region where the second conductive region 24d of the driving TFT 24 is formed.

As illustrated in FIG. 6B, the organic EL element 26 includes an emissive element layer 270 provided between the first electrode 262 formed as an individual pattern for each pixel on the substrate side and connected to the driving TFT 24 and a second electrode 264. The first electrode 262 can be formed of a transparent conductive metal oxide or the like, such as ITO (indium tin oxide), and functions as an anode (hole injection electrode) in this example. The second electrode 264 can be formed of a metal material with a small work function, such as Al and Ag, or have a multi-layer structure composed of such a metal material and ITO described above, and functions as a cathode (electron injection electrode). Note that an edge portion of the first electrode 262 formed as an individual pattern for each pixel is covered with a second planarization insulating layer 110 formed on top of the planarization insulating layer 108, thereby preventing short-circuiting between the first electrode 262 and the second electrode 264 provided on the emissive element layer 270 formed as a very thin layer.

The emissive element layer 270 has a three-layer structure composed of a hole transport layer 272, an emissive layer 274, and an electron transport layer 276 in this example. It is not limited to such a three-layer structure, and it may be formed as a single layer having light emissive function, or as a multi-layer structure including two layers or more than four layers. When a multi-layer structure is used for the emissive element layer 270, all layers may be shared by all pixels, or some or all layers may be formed as an individual pattern for each pixel as in the example of FIG. 6B where only the emissive layer 274 is formed as an individual pattern similarly to the first electrode 262.

In the thus configured organic EL element 26, according to the present embodiment, a current supplied from the power source line PL through the driving TFT 24 to the first electrode 262 flows between the electrode 262 and the second electrode 264, causing light emission in the emissive element layer at the luminance in accordance with the amount of current. Light is emitted when emissive particles excited by recombination of holes injected from the first electrode 262 and electrons injected from the second electrode 264 in the emissive element layer return to the ground state. In this example, light is transmitted through the transparent first electrode 262 and substrate 100 to exit outside from the substrate, and is observed.

In the layout of the present embodiment, the above-described correction TFT 22 and the driving TFT 24 are arranged as close as possible to each other sandwiching the power source line PL as described above. Particularly, the channel region 22c of the correction TFT 22 and the channel region 24c of the driving TFT 24 are arranged so that at least part of the channel regions thereof are juxtaposed in the vertical scanning direction.

The active layer of each TFT formed in the pixel in the present embodiment is formed of a low temperature polycrystalline silicon (LTPS) layer obtained through polycrystallization annealing by sequentially irradiating an amorphous silicon layer formed by plasma CVD or the like with a line-shaped pulse laser beam (see FIG. 5) set so that its longitudinal direction coincides with the horizontal scanning direction, and shifted by a predetermined pitch in its width direction. The scanning direction of the laser beam coincides with the width direction of the laser beam and the vertical scanning direction, which is the direction in which the data line DL and the like extend. As shown in FIG. 5, the respective channel regions 22c and 24c of the correction TFT 22 and the driving TFT 24 are disposed so that their channel length direction coincides with the extending direction of the data line DL and the like, i.e. the scanning direction of the laser beam. Consequently, each of the channel regions 22c and 24c is reliably irradiated with a laser beam a plurality of times in the channel length direction traversing the channel (in the channel width direction) by setting the scanning pitch of the laser beam smaller than the channel lengths of the correction TFT 22 and the driving TFT 24. As a result, even if the energy of each laser beam is varied, variation in the total amount of energy received in the entire channel length direction can be reduced in each pixel because each of the channel regions 22c and 24c is irradiated with a plurality of laser beams.

When the polycrystalline silicon layer formed through the so-called laser annealing is used for the active layer of the TFT, the polycrystalline state substantially affecting the properties (particularly the threshold) of the TFTs can be easily equalized between the correction TFT 22 and the driving TFT 24 by disposing the channel regions 22c and 24c in close proximity to each other so that the regions to be the channel regions 22c and 24c of the correction TFT 22 and the driving TFT 24 are simultaneously irradiated with the same pulse laser beam.

One irradiation area of the line-shaped pulse laser is sized, for example, 10 cm to 30 cm long in the longitudinal direction of the pulse and approximately 300 μm in the pulse width direction. The scanning pitch of the thus sized pulse laser is, for example, on the order of 25 μm. In other words, the amorphous silicon is polycrystallized by shifting the irradiation position of the pulse laser by 25 μm. Further, each of the channel regions 22c and 24c of the correction TFT 22 and the driving TFT 24 can be irradiated with the same pulse laser beam by disposing, not only in close proximity to each other, but also at least part of the channel regions 22c and 24c to be juxtaposed on the same line extending in the direction crossing the vertical scanning direction. Further, by setting each of the correction TFT 22 and the driving TFT 24 to have the channel length of at least 30 μm or longer, preferably 40 μm or longer, the channel regions 22c and 24c of the two TFTs can be reliably irradiated with at least one or more of the same pulse laser beam by scanning the channel formation regions with the above-sized pulse laser by the above-described pitch along the vertical scanning direction of the pixel.

Further, for simultaneous doping of the impurities of the same conductivity type into the semiconductor layers 120 and 124 using each of the gate electrodes 22g and 24g as a mask, impurity doping conditions (doping density, doping energy, and the like) can be equalized because the formation areas are very close to each other. Thus, also in this respect, the properties of the correction TFT 22 and the driving TFT 24 can be equalized.

In the above-described layout within the pixel region, circuit elements, such as the data line DL, the power source line, and the TFTs 20, 22, and 24, are disposed in the region on one side (left side in the pixel of FIG. 5) in the horizontal scanning direction of the pixel region, while the organic EL element 26 is disposed on the other side (right side in the pixel of FIG. 5), thereby achieving efficient arrangement as a whole. More specifically, such a layout can provide the organic EL element 26 with the maximum possible area within each pixel region, contributing to improvement in aperture ratio of the display device. Further, when lifetime of each pixel is equalized by varying the pixel area for each color of emitted light in view of light emission efficiency and the required luminance, it is possible to easily change only the area of the organic EL element 26 without changing the layout and areas of the TFTs 20, 22, and 24, the storage capacitor 28, and the like, so that design efficiency can be improved.

For the layout illustrated in FIG. 5, the so-called delta arrangement is employed, in which the pixels of the same color among the pixels arranged in a matrix are shifted for each row in the horizontal scanning direction by a predetermined pitch. When a single data line DL supplies the data signal Vdata to the pixels of the same color, the data line DL extends meandering in the column direction of the matrix, as illustrated in FIG. 5, to be connected to the selection TFT 20 of each of the pixels of the same color alternately arranged on the right and left sides of the line. Because such a layout is employed, in the pixel of the row subsequent to that shown in FIG. 5, the above-described organic EL element 26 is disposed on the left side of the pixel, and the TFTs 20, 22, and 24, and the like are on the right side of the pixel, as opposed to the layout of FIG. 5. Naturally, the above-described layout is not limited to the delta arrangement, and is also applicable to the stripe arrangement, in which the organic EL element and the TFTs and the like for controlling the element are not horizontally inverted in position for each row.

In the correction TFT 22 of the present embodiment, the width of the channel region 22c (channel width) formed of the semiconductor layer changes in the channel length direction as illustrated in FIG. 5. More specifically, in FIG. 5, the width is increased on the side close to the selection TFT 20 (upper side of the figure), and decreased on the side connected to the storage capacitor 28 and the driving TFT 24 (lower side of the figure). By thus providing the correction TFT 22 with the portion having the width varying in its channel length direction at least from other portions, the degree of freedom in arranging the correction TFT 22 can be enhanced. As the property of the correction TFT 22, the smallest channel width can be regarded as the standard. Such enhancement in degree of freedom in arranging the correction TFT 22 allows efficient layout of other circuit elements, such as the gate electrode 24g of the driving TFT 24. For increasing the degree of freedom in arrangement, the width of the semiconductor layer forming the channel region (channel width direction) is preferably varied, and the degree of freedom in arrangement can further be enhanced by varying the channel width of other elements, such as the selection TFT 20 and the driving TFT 24.

As described above, the pixel circuits according to the present embodiment are arranged in a matrix to form a display device. In most cases, the pixel region including the organic EL element and a peripheral driver circuit for driving each pixel located in the periphery thereof are formed on a glass substrate. An organic EL panel is formed according to the following procedure. Circuit elements other than the organic EL element in the pixel region and the peripheral driver circuit are first formed on the substrate, the organic EL element is formed above these circuit elements, and a sealing substrate is bonded to the glass substrate 100 covering the substrate from the element side. Note that the pixel circuit of the present embodiment is not only used in such an organic EL panel, but can also be applied to various other display devices. Particularly, similar effects can be enjoyed in the application into the device in which a display element of a current driving type and a circuit (TFT) for controlling this element are formed for each pixel.

Figure 7:
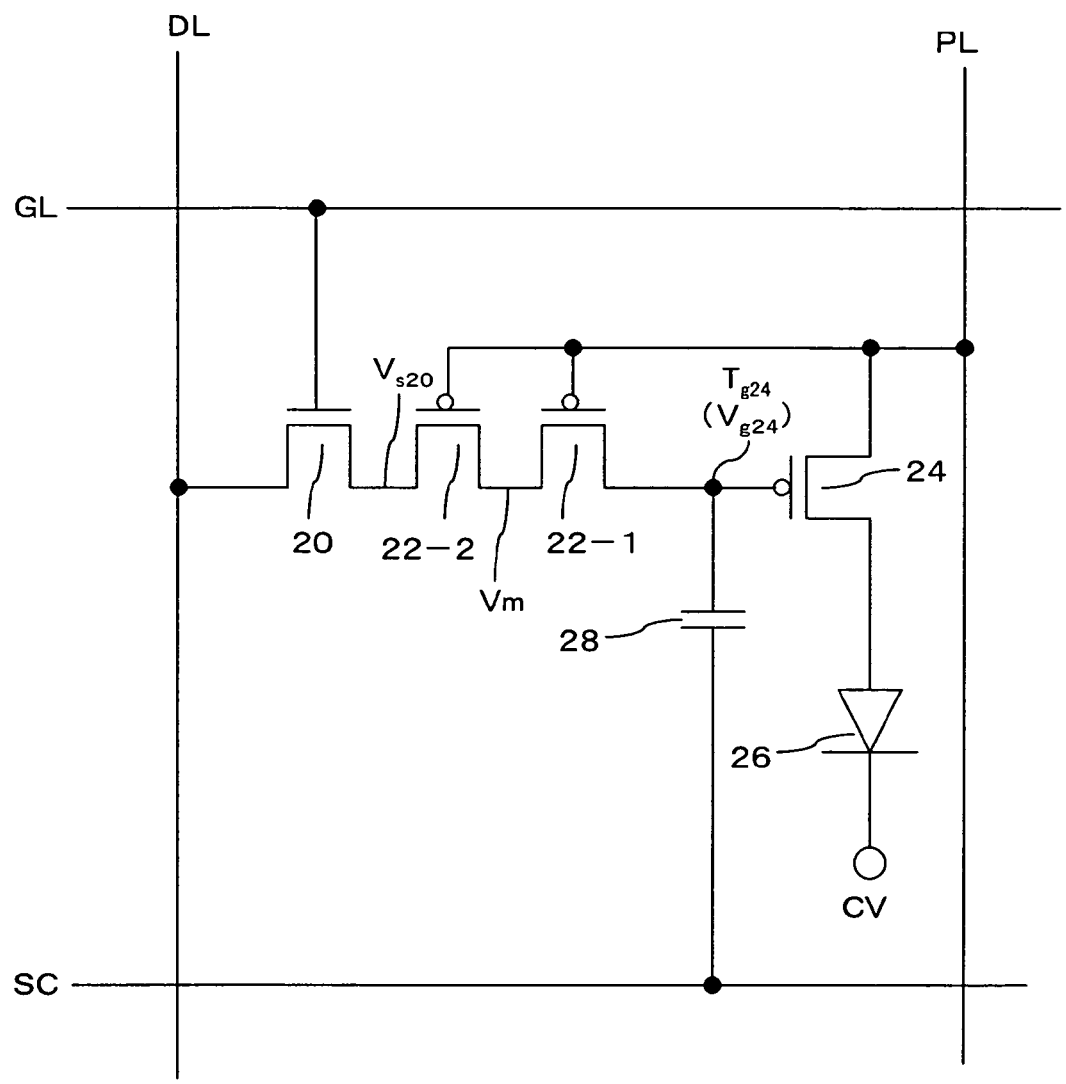
FIG. 7 shows an equivalent circuit per pixel obtained when a correction TFT is multigated according to the embodiment of the present invention.
Figure 9:
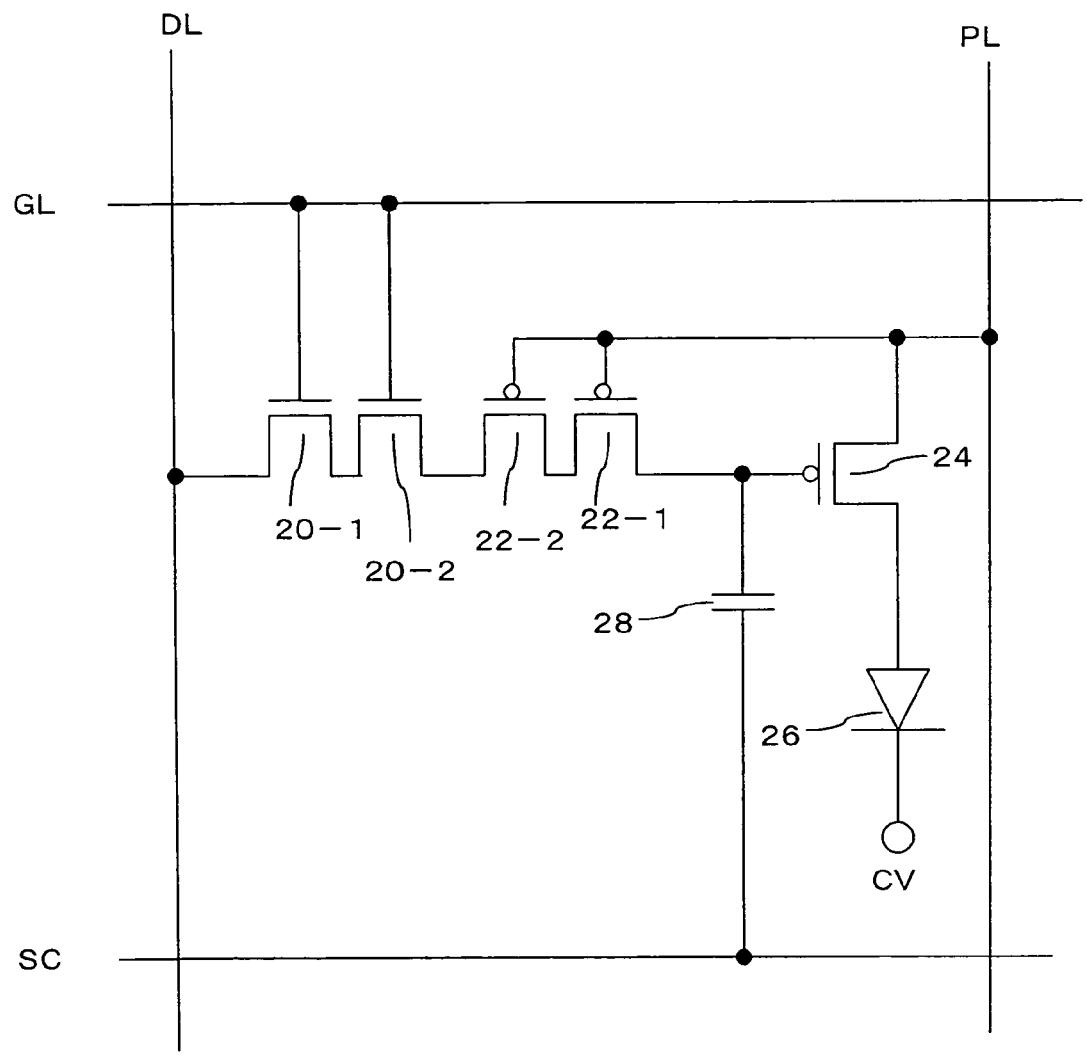
FIG. 9 shows an equivalent circuit obtained when a selection TFT and the correction TFT are both multigated according to the embodiment of the present invention.

In the present embodiment, the selection TFT 20 and the correction TFT 22 are preferably multigated. This is because it is effective to reduce a leakage current often observed particularly in TFTs having a polycrystalline silicon layer as an active layer. The leakage current is a current flowing toward the data line DL through the correction TFT 22 and the selection TFT 20 when these TFTs are off in the present embodiment, and can be suppressed by multigating these TFTs. Only the correction TFT 22 may be multigated, as illustrated in FIG. 7, or only the selection TFT 20 may be multigated. Both of the TFTs may, of course, be multigated as illustrated in FIG. 9.

Figure 8:
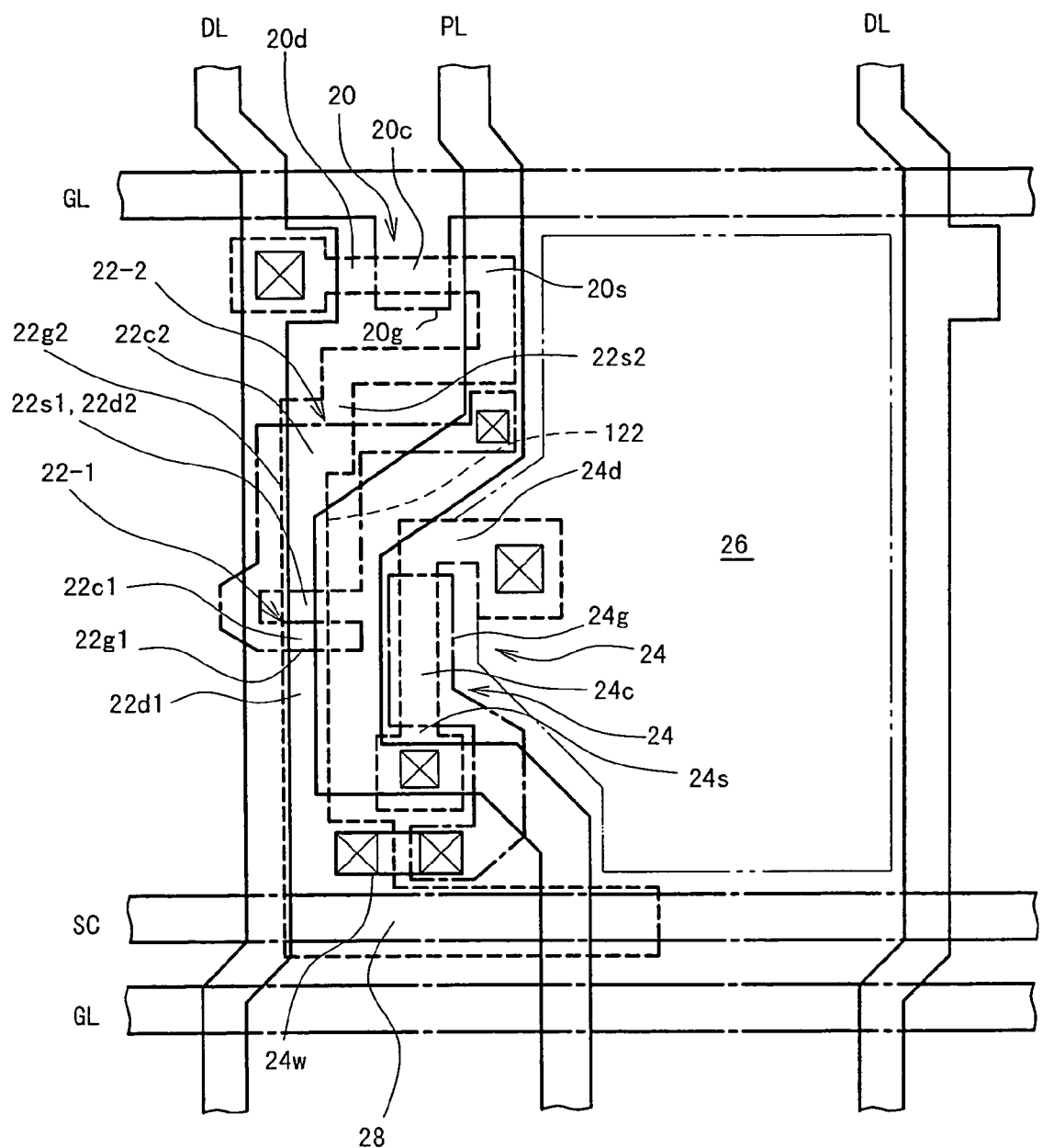
FIG. 8 is a schematic plan view showing an example of a layout implementing the equivalent circuit of FIG. 7.

FIG. 7 is an equivalent circuit diagram of the circuit in which the correction TFT 22 is multigated, and FIG. 8 is a plan view showing an example of a layout implementing the equivalent circuit. In the example of FIG. 7, a so-called double gate structure is employed for the correction TFT 22. More specifically, two TFTs, namely a first correction TFT 22-1 whose drain is connected to the node Tg24 and a second correction TFT 22-2 provided between the first correction TFT 22-1 and the selection TFT 20, are provided between the node Tg24 and the selection TFT 20. The gates of the first and second correction TFTs 22-1, 22-2 are both connected to the power source line PL, and the source and drain of each of the first and second correction TFTs 22-1, 22-2 are electrically connected in series between the selection TFT 20 and the node Tg24. Such a connection enhances off-leakage tolerance between the driving TFT 24 and the selection TFT 20, thereby effectively preventing the gate voltage $V_{g24}$ of the driving TFT 24 stored in the storage capacitor 28 from leaking to the data line DL to deviate from a proper value.

More specifically, by dividing the correction TFT 22, a voltage $V_{s20}$ of the selection TFT 20 on the source side (the source voltage $V_{d22\text{-}2}$ of the correction TFT 22-2) and the voltage $V_{g24}$ of the node Tg24 are divided at a connection node between the first and second correction TFTs 22-1 and 22-2, whereby a voltage Vm of a value in between becomes a source voltage of the first correction TFT 22-1. The off-leakage current of the TFT is reduced by approximately one digit when the drain-source voltage Vds of the TFT is decreased by 1 V. Consequently, division of the correction TFT 22 contributes to decrease in the drain-source voltage Vds of the first correction TFT 22-1 whose drain is connected to the node Tg24, thereby reducing the off-leakage current.

When the correction TFT 22 is multigated as illustrated in FIG. 7, the channel region of the first correction TFT 22-1 whose conductive region (drain in this example) is connected to the gate of the driving TFT 24 need not be sized equal to the channel region of the other TFT, such as the second correction TFT 22-2.

When, for example, the channel region of the first correction TFT 22-1 is sized smaller than that of the second correction TFT 22-2, a gate capacitance Cg22-1 of the first correction TFT 22-1 can be decreased. If a large amount of electric charges flow into the storage capacitor 28 from the gate capacitor Cg22 when the correction TFT 22 is turned off, the potential of the node Tg24 is maintained at a high value for a long time, lowering the speed of voltage decline following the fall of the capacitor line SC. As a result, by decreasing the channel size of the first correction TFT 22-1, the amount of electric charges flowing into the storage capacitor 28 from the gate capacitor Cg22-1 of the first correction TFT 22-1 when it is off is reduced, thereby achieving fast decline of the voltage at the node Tg24. In this case, the relation W1×L1<W2×L2 is preferably satisfied wherein the channel length and channel width of the channel region of the first correction TFT 22-1 are denoted as L1 and W1, respectively, and the channel length and channel width of the channel region of the second correction TFT 22-2 are denoted as L2 and W2, respectively.

The channel length L1 of the first correction TFT 22-1 is minimized, but long enough to at least satisfy the requirement of off-leakage reduction, while the channel width W1 thereof has the allowable maximum length in view of layout restrictions. Although the longer channel length L2 of the correction TFT 22-2 contributes to slower flow of electric charges to the node Tg24 from the gate capacitor Cg22-2 of the second correction TFT 22-2, it will increase the on-resistance of the TFT, resulting in a longer data writing period. Consequently, the value of L2/W2 is preferably small, i.e. the width W2 is increased for the longer L2. Therefore, in this respect also, it is also preferable to satisfy the above relation of W1×L1<W2×L2.

FIG. 8 is a planar configuration of a layout example in which the correction TFT 22 is multigated as described above. While, in the example of FIG. 8 as well, the active layers of the selection TFT 20 and the correction TFT 22 are integrally formed of the same conductive layer, the semiconductor layer forming the active layers of the first and the second correction TFTs 22-1 and 22-2 is labeled with the numeral 122 in the figure for illustration purposes. The semiconductor layer 122 extends toward the adjacent row (downward in the figure) along the data line DL as in the layout of FIG. 5 described above.

The gate electrodes 22g (22g1 and 22g2) of the correction TFTs 22-1 and 22-2 are shared and connected to the power source line PL in a region located below the power source line PL. The gate electrode 22g extends in the horizontal scanning direction toward the data line DL from a position contacting the power source line PL, and a region crossing over the active layer 122 functions as the gate electrode 22g2 of the second correction TFT 22-2. From here it extends to the region where the data line DL is formed, and folds back immediately after crossing the data line DL to extend under the data line DL. Near a region crossing under the data line DL, the gate electrode 22g extends again toward the pixel in the next row along the extending direction of the data line DL to cover above the active layer 122, and a region overlapping the active layer 122 functions as the gate electrode 22g1 of the first correction TFT 22-1. The gate electrode 22g1 of the first correction TFT 22-1 is formed between layers of the power source line PL and the active layer 122, and electrically shields the active layer 122 from the power source line PL and the data line DL provided above.

By thus patterning the gate electrode 22g to fold back in the U-shape, the upper part of the semiconductor layer 122 extending in the vertical scanning direction along the data line DL is covered at, for example, two sites, so that channel regions 22c2 and 22c1 can be formed at the portions covered with the gate electrode 22g. In the semiconductor layer 122, a source region 22s2, the channel region 22c2 (the region below the gate electrode 22g2), and a drain region 22d2 of the second correction TFT 22-2 are formed in this order from the side of the second correction TFT 22-2 connecting to the selection TFT 20, and a source region 22s1, the channel region 22c1 (the layer below the gate electrode 22g1), and a drain region 22d1 of the first correction TFT 22-1 are formed. The drain region 22d1 of the first correction TFT 22-1 is connected to the capacitor electrode 28e of the storage capacitor 28 (the same semiconductor layer), and to the gate electrode 24g of the driving TFT 24 through the metal wiring line 24e.

The layout as illustrated in FIG. 8 can minimize an increase in area where the element is disposed even if the correction TFT 22 is multigated (double-gated in this example)

Figure 10:
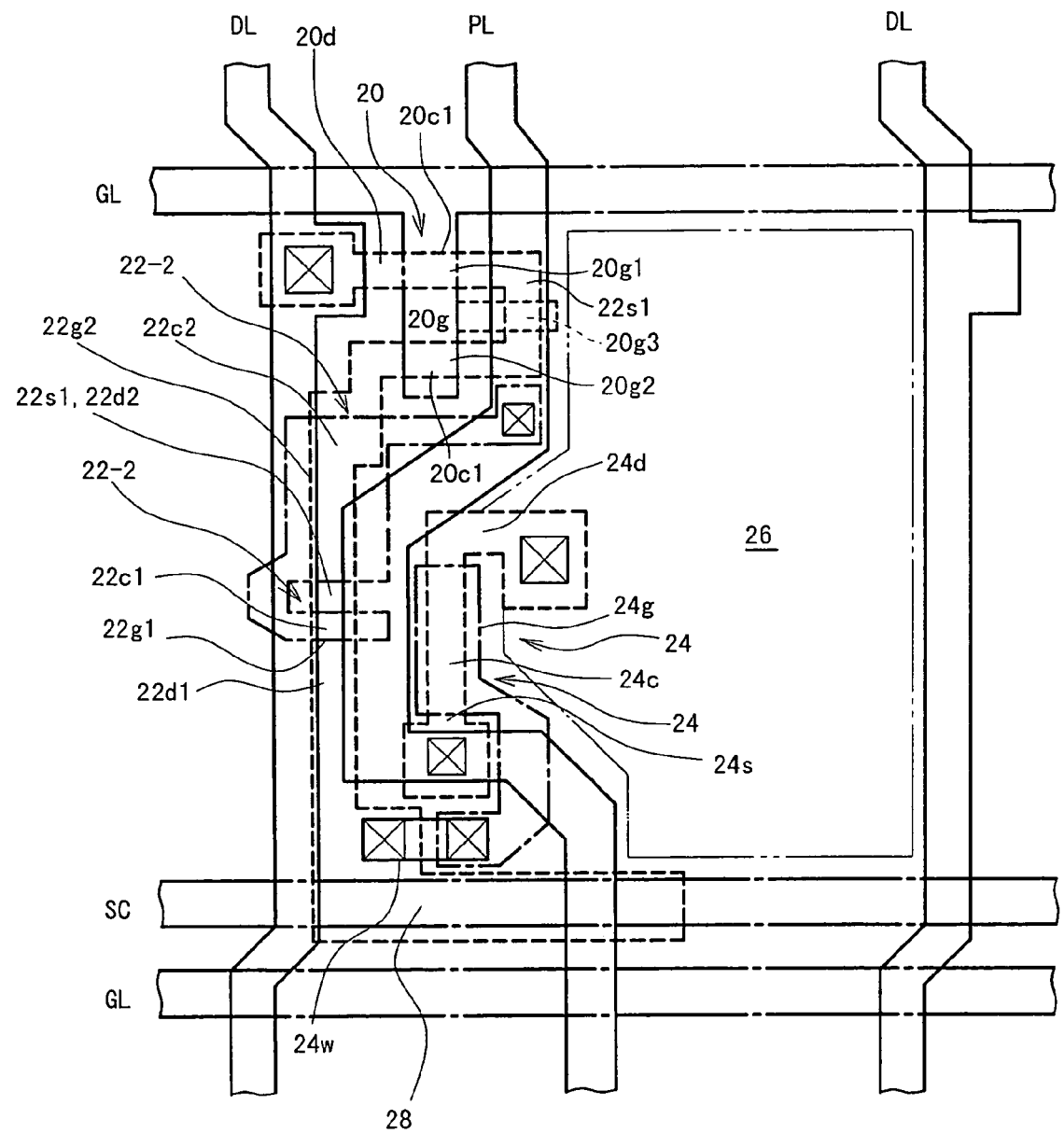
FIG. 10 shows an example of a layout implementing the equivalent circuit of FIG. 9.

FIG. 9 shows a circuit configuration example in which the above-described selection TFT 20 is also multigated in addition to the correction TFT 22. FIG. 10 is a plan view illustrating an actual layout example when the circuit configuration of FIG. 9 is implemented. In the example of FIG. 9, the selection TFT is composed of two selection TFTs 20-1 and 20-2 connected in series to the data line DL. The gates of the two selection TFTs 20-1 and 20-2 are both connected to the gate line GL.

The selection TFT 20 can be easily multigated by adding a simple change to the layout of a single-gate selection TFT 20 illustrated in FIG. 5 and the like. For example, as also illustrated in FIG. 10, the semiconductor layer 120 forming the active layer of the selection TFT 20 is U-shaped, extending from the data line DL and folding back at the power source line PL near a region for forming the selection TFT 20. Consequently, the gate electrode 20g protruding from the gate line GL may be patterned to further extend as indicated by a dotted line in FIG. 10 to overlap above the semiconductor layer 120 folding back from the power source line PL. By thus extending the gate electrode 20g to form the gate electrodes 20g1 and 20g2 at the portion of the U-shaped folding semiconductor layer 120 closer to the gate line GL and at the turn-back portion, respectively, and forming the channel regions 20c1 and 20c2 thereunder, the selection TFT 20 of the double gate type whose active layers are electrically connected in series to the data line DL can easily be formed. As further illustrated in FIG. 10, a selection TFT 20 of a triple gate type in which three active layers thereof are connected in series to the data line DL can be obtained by providing a projecting portion in the horizontal scanning direction in the middle of the gate electrode 20g, and covering the upper layer of the base portion of the U-shaped active layer with the projecting portion.

Figure 11:
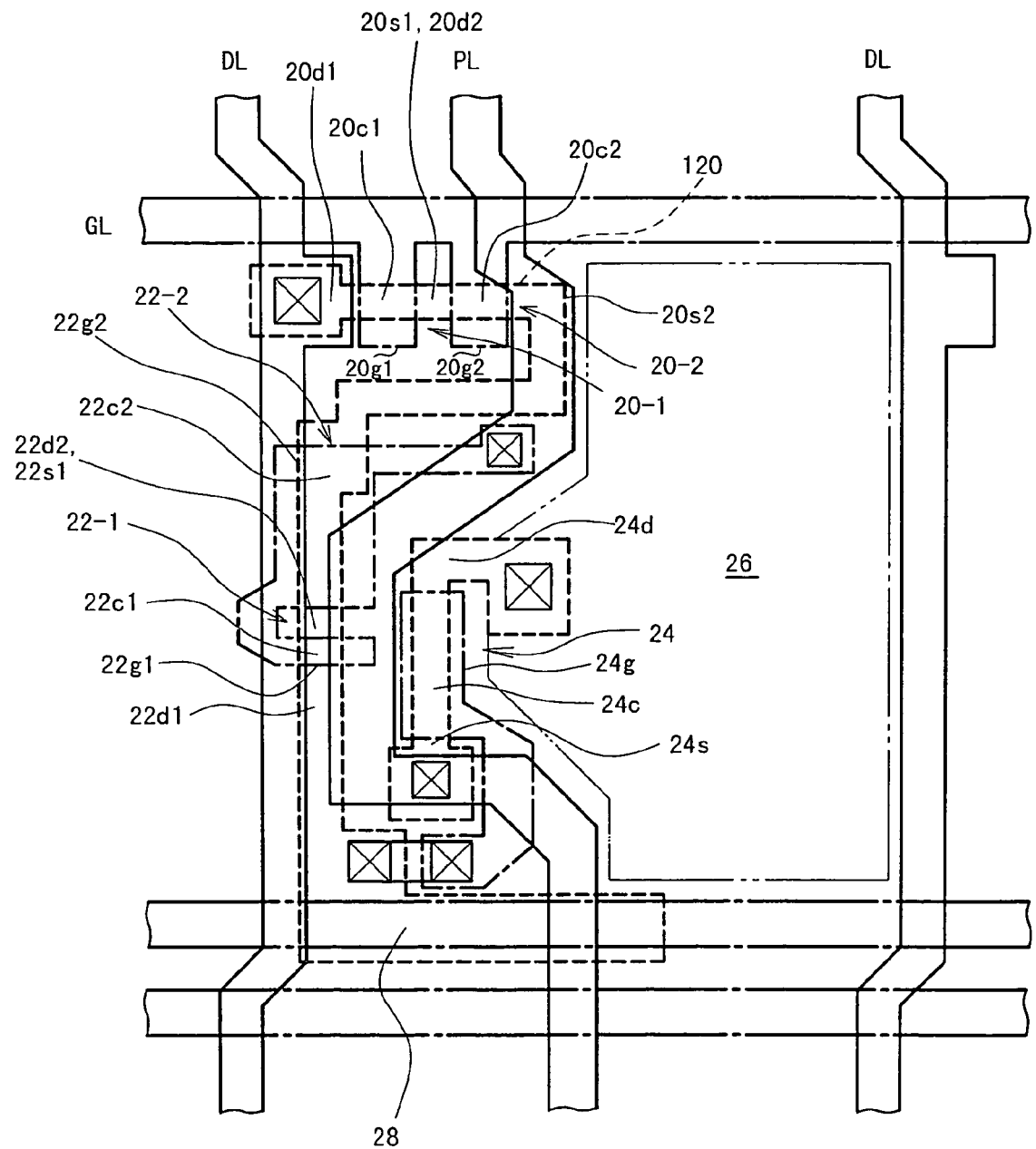
FIG. 11 shows a different example of a layout from that shown in FIG. 10.

FIG. 11 illustrates another layout example of a multigated (double-gated) selection TFT 20. In the layout of FIG. 11, two gate electrodes 20g1 and 20g2 are formed juxtaposed projecting from the gate line GL, which extends in the horizontal scanning direction, toward the semiconductor layer 120 disposed from the region contacting the data line DL in the horizontal scanning direction along the gate line GL. In this example, the channel regions 20c1 and 20c2 of the multigated selection TFT 20 are disposed juxtaposed in the horizontal scanning direction which is the extending direction of the gate line GL.

As described above, the off-leakage current can further be effectively suppressed by multigating the selection TFT 20 in addition to the correction TFT 22.

Figure 12:
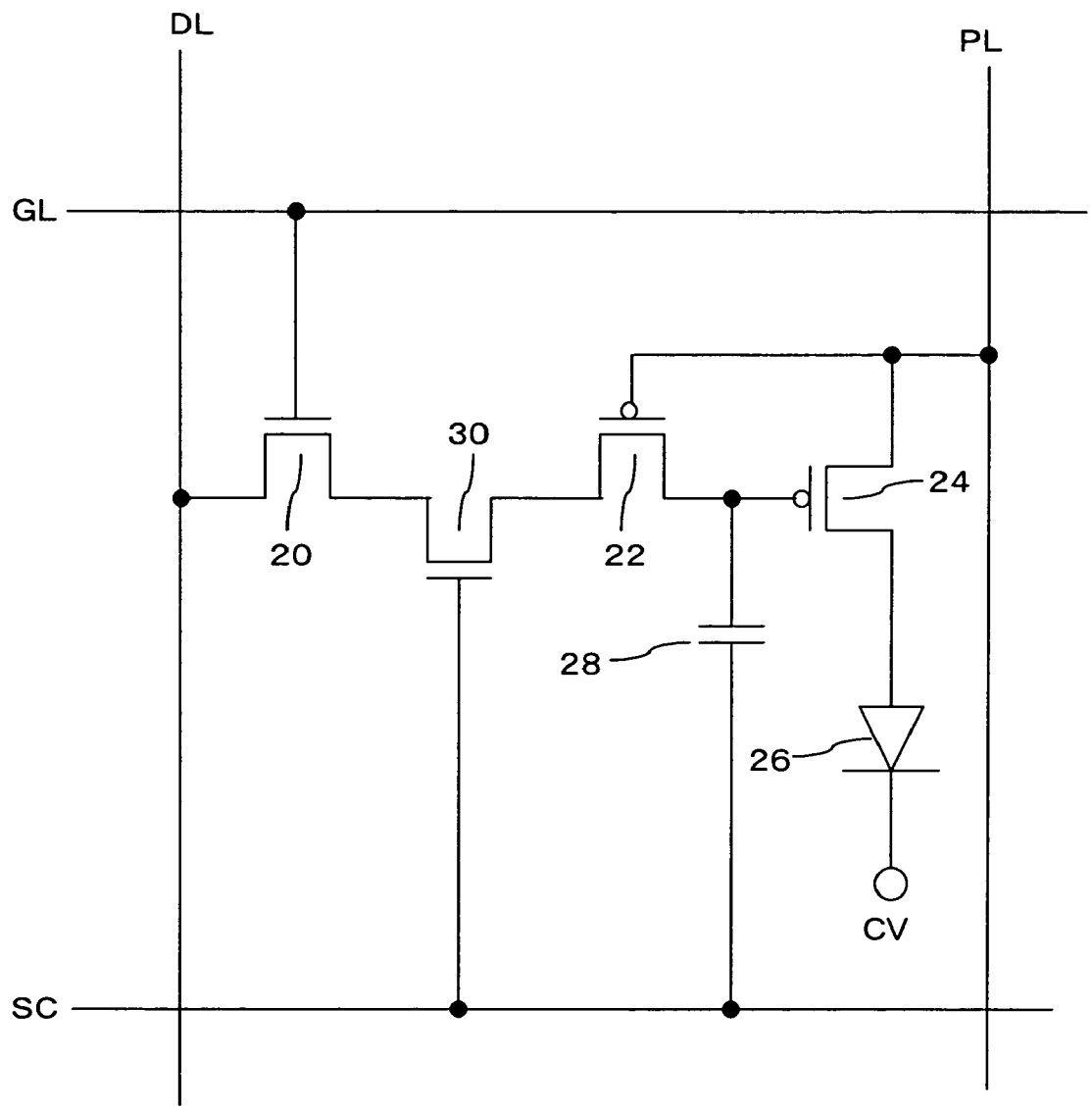
FIG. 12 shows a further example of a circuit configuration according to the embodiment of the present invention.
Figure 13:
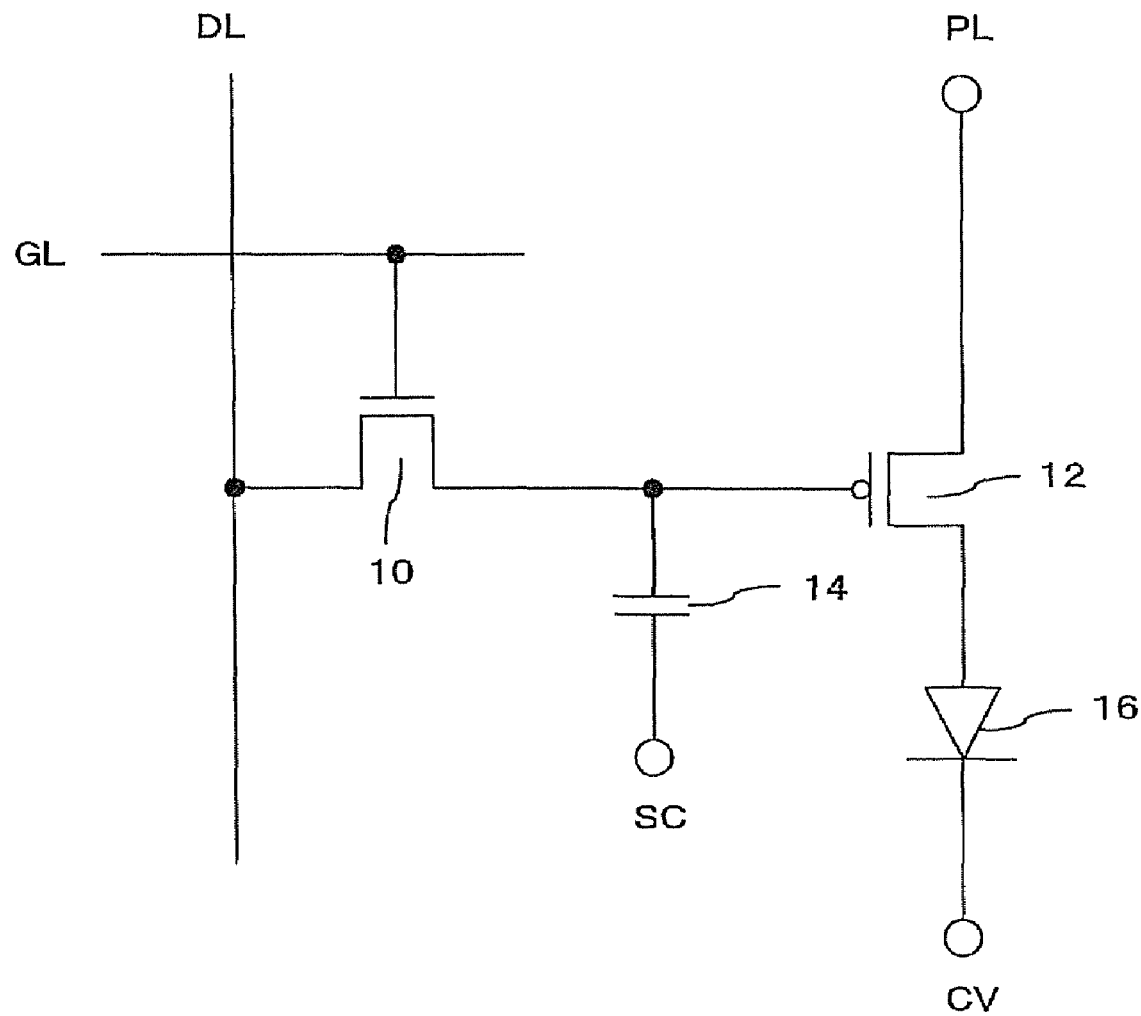
FIG. 13 shows a configuration of a conventional pixel circuit.

FIG. 12 illustrates a further circuit configuration example. In the equivalent circuit configuration per pixel illustrated in FIG. 12, the data line DL is connected to one end (first conductive region, such as the drain) of the selection TFT 20, and between the other end (second conductive region, such as the source) of the selection TFT 20 and the first conductive region (such as the source) of the above correction TFT 22, a leakage current suppression TFT 30 having a gate connected to the capacitor line SC is further provided. The leakage current suppression TFT 30 has an n-channel, and the polarity is opposite to that of the correction TFT 22.

The leakage current suppression TFT 30 is turned on when the capacitor line SC is at the H level, and turned off when it is at the L level. Consequently, it is in the ON state while the gate line GL is at the H level, and therefore no problems arise by writing the data voltage Vdata of the data line DL into the gate of the driving TFT 24. On the other hand, after data writing is complete, the TFT is turned off because the capacitor line SC falls to the L level. More specifically, when the capacitor line SC falls and the gate potential of the driving TFT 24 becomes a low voltage, the leakage current suppression TFT 30 maintains the OFF state, thereby effectively suppressing the leakage current flowing from the data line DL toward the gate of the driving TFT 24 in this state. As a result, uniformity in luminance of light emitted from each of a plurality of pixels in a display device can be further enhanced. While reduction in the off-leakage current can be further pursued by multigating the correction TFT 22 in the configuration of FIG. 12, an increase in circuit elements causes a decline in aperture ratio. Therefore, it is preferable to decide whether or not to multigate the correction TFT within a range maximizing the aperture ratio and achieving uniform luminance of light emitted form each pixel.

INDUSTRIAL APPLICABILITY

The invention is applicable to a display device and the like including a display element for each pixel.

The invention claimed is:

1. A pixel circuit, comprising:
    a selection transistor having one end connected to a data line, and a control end receiving a selection signal;
    a correction transistor having one end connected to the other end of the selection transistor, and a control end connected to a first power source at a predetermined voltage;
    a driving transistor having a control end connected to the other end of the correction transistor, and one end connected to a second power source functioning as a current supply source;
    a storage capacitor having one end connected to the control end of the driving transistor, and the other end connected to a pulse voltage line; and
    an emissive element for emitting light caused by a current flowing through the driving transistor, wherein
    the correction transistor is switched between on and off states in a process of turning on the driving transistor by changing a voltage value of the pulse voltage line, thereby controlling a voltage of the control end of the driving transistor when it is turned on, and
    the driving transistor and the correction transistor are formed adjacent to each other, wherein
    a data voltage for turning on the correction transistor is supplied to the data line while the selection transistor is ON, a voltage corresponding to the data voltage is stored at the control end of the driving transistor, the selection transistor is turned off thereafter, and the voltage of the control end of the driving transistor is shifted by changing the voltage of the pulse voltage line in this state, thereby turning off the correction transistor and turning on the driving transistor to cause a current in accordance with the data voltage to flow into the driving transistor.

2. A pixel circuit according to claim 1, wherein
    the correction transistor and the driving transistor are p-channel transistors, and the pulse voltage line changes from a high level to a low level after the selection transistor is turned off.

3. A pixel circuit according to claim 1, wherein
    active layers of the correction transistor and the driving transistor are formed of polycrystalline semiconductor obtained by polycrystallization laser annealing, and
    a channel length direction of the correction transistor and a channel length direction of the driving transistor are disposed in parallel to a scanning direction of a line-shaped pulse laser irradiation, when performing the polycrystallization laser annealing, onto a semiconductor layer which is an object of the polycrystallization and at least part of both channel regions of the correction transistor and the driving transistor are located on the same line extending in a direction crossing the scanning direction of the pulse laser.

4. A pixel circuit, comprising:
    a selection transistor having one end connected to a data line, and a control end receiving a selection signal;
    a correction transistor having one end connected to the other end of the selection transistor, and a control end connected to a first power source at a predetermined voltage;
    a driving transistor having a control end connected to the other end of the correction transistor, and one end connected to a second power source functioning as a current supply source;
    a storage capacitor having one end connected to the control end of the driving transistor, and the other end connected to a pulse voltage line; and
    an emissive element for emitting light caused by a current flowing through the driving transistor, wherein
    the correction transistor is switched between on and off states in a process of turning on the driving transistor by changing a voltage value of the pulse voltage line, thereby controlling a voltage of the control end of the driving transistor when it is turned on, and
    the driving transistor and the correction transistor are formed adjacent to each other, wherein
    the first power source and the second power source are the same power source.

5. A pixel circuit according to claim 4, wherein
    the data line and the power source line extend in a vertical scanning direction, and the correction transistor is formed between the data line and the power source line.

6. A pixel circuit according the claim 5, wherein
    the driving transistor is formed on a side opposite to the correction transistor with the power source line located in between.

7. A pixel circuit according to claim 5, wherein
    the first power source and the second power source are the same power source.

8. A pixel circuit according to claim 5, wherein
    the correction transistor and the driving transistor are p-channel transistors, and the pulse voltage line changes from a high level to a low level after the selection transistor is turned off.

9. A pixel circuit according to claim 5, wherein
    active layers of the correction transistor and the driving transistor are formed of polycrystalline semiconductor obtained by polycrystallization laser annealing, and
    a channel length direction of the correction transistor and a channel length direction of the driving transistor are disposed in parallel to a scanning direction of a line-shaped pulse laser irradiation, when performing the polycrystallization laser annealing, onto a semiconductor layer which is an object of the polycrystallization and at least part of both channel regions of the correction transistor and the driving transistor are located on the same line extending in a direction crossing the scanning direction of the pulse laser.

10. A pixel circuit, comprising:
    a selection transistor having one end connected to a data line, and a control end receiving a selection signal;
    a correction transistor having one end connected to the other end of the selection transistor, and a control end connected to a first power source at a predetermined voltage;

a driving transistor having a control end connected to the other end of the correction transistor, and one end connected to a second power source functioning as a current supply source;

a storage capacitor having one end connected to the control end of the driving transistor, and the other end connected to a pulse voltage line; and an emissive element for emitting light caused by a current flowing through the driving transistor, wherein the correction transistor is switched between on and off states in a process of turning on the driving transistor by changing a voltage value of the pulse voltage line, thereby controlling a voltage of the control end of the driving transistor when it is turned on, and the driving transistor and the correction transistor are formed adjacent to each other, wherein the data line and the power source line extend in a vertical scanning direction, and the correction transistor is formed between the data line and the power source line, wherein a data voltage for turning on the correction transistor is supplied to the data line while the selection transistor is ON, a voltage corresponding to the data voltage is stored at the control end of the driving transistor, the selection transistor is turned off thereafter, and the voltage of the control end of the driving transistor is shifted by changing the voltage of the pulse voltage line in this state, thereby turning off the correction transistor and turning on the driving transistor to cause a current in accordance with the data voltage to flow into the driving transistor.

11. A display device including a plurality of pixels arranged in a matrix, each pixel comprising:

a display element operating in accordance with supplied power;

a selection transistor having a first conductive region connected to a data line, and a control end receiving a selection signal;

a driving transistor having a first conductive region connected to a power source line for supplying power to the display element;

a correction transistor having a control end connected to a first power source at a predetermined voltage, a first conductive region connected to a second conductive region of the selection transistor, and a second conductive region connected to a control end of the driving transistor; and a storage capacitor having a first electrode connected to the control end of the driving transistor and the second conductive region of the correction transistor, and a second electrode connected to a pulse voltage line; wherein in accordance with the operation threshold thereof, the correction transistor controls, in accordance with a change in a voltage of the control end of the driving transistor in response to a change in a voltage of the pulse voltage line, the voltage of the control end of the driving transistor when the driving transistor turns on, the correction transistor and the driving transistor are formed as transistors of the same conductivity type, and at least a channel region of each of the correction transistor and the driving transistor is formed of a semiconductor layer polycrystallized through laser annealing, and the channel regions thereof are disposed in close proximity to each other, wherein the correction transistor includes an active layer formed between the data line and the power source line to extend partially underlying at least one of these lines.

12. A display device according to claim 11, wherein a channel length direction of the correction transistor and a channel length direction of the driving transistor are disposed in parallel to a scanning direction of a line-shaped pulse laser irradiated upon the polycrystallization laser annealing, and at least part of both channel regions of the correction transistor and the driving transistor are located on the same line extending in a direction perpendicular to the scanning direction of the pulse laser.

13. A display device according to claim 11, wherein the channel region of the correction transistor has portions differing in channel width in the channel length direction thereof.

14. A display device including a plurality of pixels arranged in a matrix, each pixel comprising:

a display element operating in accordance with supplied power;

a selection transistor having a first conductive region connected to a data line, and a control end receiving a selection signal;

a driving transistor having a first conductive region connected to a power source line for supplying power to the display element;

a correction transistor having a control end connected to a first power source at a predetermined voltage, a first conductive region connected to a second conductive region of the selection transistor, and a second conductive region connected to a control end of the driving transistor; and a storage capacitor having a first electrode connected to the control end of the driving transistor and the second conductive region of the correction transistor, and a second electrode connected to a pulse voltage line; wherein in accordance with an operation threshold thereof, the correction transistor controls, in accordance with a change in a voltage of the control end of the driving transistor in response to a change in a voltage of the pulse voltage line, the voltage of the control end of the driving transistor when the driving transistor turns on, the correction transistor and the driving transistor are formed as transistors of the same conductivity type, and at least part of an active layer of the correction transistor is formed below the power source line with an insulating layer disposed in between.

15. A display device according to claim 14, wherein the first power source is also used as the power source line, and the control end of the correction transistor connected to the power source line is formed between the active layer of the correction transistor and a layer of the power source line.

16. A display device according to claim 14, wherein the channel region of the correction transistor has portions differing in channel width in the channel length direction thereof.

17. A display device according to claim 14, wherein the correction transistor includes an active layer formed between the data line and the power source line to extend partially underlying at least one of these lines.

* * * * *

UNITED STATES PATENT AND TRADEMARK OFFICE
CERTIFICATE OF CORRECTION

PATENT NO.        : 7,477,218 B2                                         Page 1 of 1
APPLICATION NO. : 10/541373
DATED             : January 13, 2009
INVENTOR(S)       : Masayuki Koga et al.

It is certified that error appears in the above-identified patent and that said Letters Patent is hereby corrected as shown below:

<u>Title Page</u>

Primary Examiner "Robert R. Rainey" should be changed to read
--Amare Mengistu--.
Below the Primary Examiner, insert --Assistant Examiner-Robert R. Rainey--.

Signed and Sealed this

Twenty-third Day of June, 2009

JOHN DOLL
*Acting Director of the United States Patent and Trademark Office*